(12) United States Patent
Yonkee et al.

(10) Patent No.: US 10,985,285 B2
(45) Date of Patent: Apr. 20, 2021

(54) METHODS FOR FABRICATING III-NITRIDE TUNNEL JUNCTION DEVICES

(71) Applicant: THE REGENTS OF THE UNIVERSITY OF CALIFORNIA, Oakland, CA (US)

(72) Inventors: Benjamin P. Yonkee, Goleta, CA (US); Asad J. Mughal, Goleta, CA (US); David Hwang, Windermere, FL (US); Erin C. Young, Santa Barbara, CA (US); James S. Speck, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/325,246

(22) PCT Filed: Aug. 17, 2017

(86) PCT No.: PCT/US2017/047346
§ 371 (c)(1),
(2) Date: Feb. 13, 2019

(87) PCT Pub. No.: WO2018/035324
PCT Pub. Date: Feb. 22, 2018

(65) Prior Publication Data
US 2019/0207043 A1  Jul. 4, 2019

Related U.S. Application Data

(60) Provisional application No. 62/491,493, filed on Apr. 28, 2017, provisional application No. 62/414,385,
(Continued)

(51) Int. Cl.
*H01L 31/0304* (2006.01)
*H01L 29/207* (2006.01)
(Continued)

(52) U.S. Cl.
CPC .... *H01L 31/03044* (2013.01); *H01L 21/0254* (2013.01); *H01L 21/02579* (2013.01);
(Continued)

(58) Field of Classification Search
CPC . H01L 23/03044; H01L 33/007; H01L 33/32; H01L 21/02579; H01L 21/0254;
(Continued)

(56) References Cited

U.S. PATENT DOCUMENTS 6,005,262 A    12/1999   Cunningham et al.
2008/0014597 A1    1/2008   Liu
(Continued)

FOREIGN PATENT DOCUMENTS

WO    2016/070185    5/2016
WO    2017011387 A1    1/2017

OTHER PUBLICATIONS

PCT International Search Report and Written Opinion dated Dec. 26, 2017, International Application No. PCT/US17/47346.
(Continued)

*Primary Examiner* — Thinh T Nguyen
(74) *Attorney, Agent, or Firm* — Gates & Cooper LLP

(57) ABSTRACT

A physical vapor deposition (e.g., sputter deposition) method for III-nitride tunnel junction devices uses metal-organic chemical vapor deposition (MOCVD) to grow one or more light-emitting or light-absorbing structures and electron cyclotron resonance (ECR) sputtering to grow one or more tunnel junctions. In another method, the surface of the p-type layer is treated before deposition of the tunnel junction on the p-type layer. In yet another method, the
(Continued)

whole device (including tunnel junction) is grown using MOCVD and the p-type layers of the III-nitride material are reactivated by lateral diffusion of hydrogen through mesa sidewalls in the III-nitride material, with one or more lateral dimensions of the mesa that are less than or equal to about 200 μm. A flip chip display device is also disclosed.

20 Claims, 24 Drawing Sheets

Related U.S. Application Data filed on Oct. 28, 2016, provisional application No. 62/376,307, filed on Aug. 17, 2016, provisional application No. 62/376,201, filed on Aug. 17, 2016.

(51) Int. Cl.
| | |
|---|---|
| H01L 33/32 | (2010.01) |
| H01L 33/00 | (2010.01) |
| H01L 21/02 | (2006.01) |
| H01L 29/36 | (2006.01) |

(52) U.S. Cl.
CPC ............ *H01L 33/007* (2013.01); *H01L 33/32* (2013.01); *H01L 29/207* (2013.01); *H01L 29/365* (2013.01); *Y02E 10/544* (2013.01)

(58) Field of Classification Search
CPC .. H01L 29/15; H01L 31/03044; H01L 29/885
USPC ......... 257/13, 14, 94, 97, 76; 438/22, 46, 47
See application file for complete search history.

(56) References Cited

U.S. PATENT DOCUMENTS

| | | | |
|---|---|---|---|
| 2008/0030877 A1 | 2/2008 | Turk et al. | |
| 2010/0224860 A1 | 9/2010 | Ibbetson et al. | |
| 2012/0180868 A1 | 7/2012 | Farrell et al. | |
| 2015/0372187 A1 | 12/2015 | Bower et al. | |
| 2016/0111594 A1* | 4/2016 | Nagel et al. ............ | H01L 33/10 257/13 |
| 2018/0047868 A1* | 2/2018 | David et al. ............ | H01L 33/06 |

OTHER PUBLICATIONS

Young, E. Hybrid tunnel junction contacts to III-nitride light-emitting diodes. Applied Physics Express, vol. 9, No. 022102, pp. 1-4, Jan. 26, 2016. URL: <http:lliopscience.iop.org/article/10.7567/APEX.9.022102>.

Agarwal et al., "Suppression of Mg propagation into subsequent layers grown by MOCVD," J. Appl. Phys., vol. 121, No. 2, p. 25106, 2017.

Cao et al., "Plasma Damage in p-GaN," J. Electron. Mater., vol. 29, No. 3, pp. 256-261, 2000.

Chang et al., "Sputtered Indium-Tin-Oxide on p-GaN," J. Electrochem. Soc., vol. 155, No. 2, p. H140, 2008.

Elkashef et al., "Sputter deposition of gallium nitride films using a GaAs target," Thin Solid Films, vol. 333, No. 1-2, pp. 9-12, 1998.

Feezell, "Status and future of GaN-based vertical-cavity surface-emitting lasers," 2015, p. 93631G-1 to 93631G-13.

Iga, "Surface-Emitting Laser-Its Birth and Generation of New Optoelectronics Field," IEEE J. Sel. Top. Quantum Electron., vol. 6, No. 6, 2000 pp. 1201-1215.

Simon et al., "Polarization-induced hole doping in wide-band-gap uniaxial semiconductor heterostructures.," Science, vol. 327, No. 5961, pp. 60-4, Jan. 2010.

Junaid et al., "Electronic-grade GaN (0001)/Al2O3 (0001) grown by reactive DC-magnetron sputter epitaxy using a liquid Ga target," Appl. Phys. Left., vol. 98, No. 14, p. 141915, 2011.

Kaneko et al., "Epitaxial indium tin oxide film deposited on sapphire substrate by solid-source electron cyclotron resonance plasma," Jpn. J. Appl. Phys., vol. 51, No. 1 Part 2, 2012, pp. 01AC02-1 to 01AC02-4.

Kaneko et al., "Properties of epitaxial AlN thin film deposited on sapphire substrate by ECR plasma," 2013 IEEE 6th Int_ Conf. Adv. Infocomm Technol. ICAIT 2013, vol. 3, No. 0001, pp. 69-70, 2013.

Keatch, "Principles of plasma discharges and material processing," Microelectronics J., vol. 27, No. 8, p. 804, Nov. 1996.

Kelly et al., "Magnetron sputtering: a review of recent developments and applications." Vacuum 56 (2000), pp. 159-172.

Kikuma et al., "GaN films deposited by planar magnetron sputtering," Vacuum, vol. 66, No. 3-4, pp. 233-237, 2002.

Kim et al., "Unusual strategies for using indium gallium nitride grown on silicon (111) for solid-state lighting," Proc. Natl. Acad. Sci. U. S. A., vol. 108, No. 25, pp. 10072-10077, 2011.

Krishnamoorthy et al., "InGaN/GaN tunnel junctions for hole injection in GaN light emitting diodes," Appl. Phys. Lett., vol. 105, No. 14, 141104-1 to 141104-4, Oct. 2014.

Krishnamoorthy et al., "Low resistance GaN/InGaNlGaN tunnel junctions," Appl. Phys. Lett., vol. 102, No. 11, pp. 113503-1 to 113503-5, 2013.

Kuwano et al., "Lateral Hydrogen Diffusion at p-GaN Layers in Nitride-Based Light Emitting Diodes with Tunnel Junctions Lateral Hydrogen Diffusion at p-GaN Layers in Nitride-Based Light Emitting Diodes with Tunnel Junctions," Jpn. J. Appl. Phys., vol. 12, pp. 8-11, 2013.

Esaki, "New Phenomenon in Narrow Germanium p-n. Junctions," Phys. Rev., vol. 109, No. 2, pp. 603-604, Jan. 1958.

Yonkee et al., "Demonstration of a III-nitride edge-emitting laser diode utilizing a GaN tunnel junction contact," Opt. Express, vol. 24, No. 7, p. 7816, Apr. 2016.

Meitl et al., "Transfer printing by kinetic control of adhesion to an elastomeric stamp," Nat. Mater., vol. 5, No. 1, pp. 33-38, 2006.

Nakamura, N. Iwasa, M. Senoh, and T. Mukai, "Hole Compensation Mechanism of P-Type GaN Films," Jpn. J. Appl. Phys., vol. 31, No. Part 1, No. 5A, pp. 1258-1266, May 1992.

Ning et al., "Numerical simulation of plasma flow downstream in an ECR plasma deposition apparatus," Vacuum, vol. 52, No. 3, pp. 219-223, Mar. 1999.

Ohba et al., "A study on strong memory effects for Mg doping in GaN metalorganic chemical vapor deposition," Elsevier J. Cryst. Growth, vol. 145, pp. 214-218, 1994.

Park et al., "Printed assemblies of inorganic light-emitting diodes for deformable and semitransparent displays," Science, vol. 325, No. 5943, pp. 977-981, 2009.

Seong-Ran et al., "Lateral current spreading in GaN-based light-emitting diodes utilizing tunnel contact junctions," Appl. Phys. Lett., vol. 78, No. 21, pp. 3265-3267, 2001.

Stringfellow, "Overview of the OMVPE Process," in Organometallic Vapor-Phase Epitaxy, 2nd ed., San Diego: Elsevier, 1999, pp. 1-16.

Takeuchi et al., "GaN-based light emitting diodes with tunnel junctions," Japanese J. Appl. Phys./Part2, vol. 40, No. 8B, pp. L861-L863, 2001.

Xie et al., "Low damage and residue-free dry etching of 6H-SiC using electron cyclotron resonance plasma," Appl. Phys. Lett., vol. 67, No. 1995, p. 368, 1995.

Xing et al., "Memory Effect and Redistribution of Mg into Sequentially Regrown GaN Layer by Metalorganic Chemical Vapor Deposition," Jpn. J. Appl. Phys, vol. 42, pp. 50-53, 2003.

Krishnamoorthy et al. "GdN Nanoisland-Based GaN Tunnel Junctions". Nano Lett. 13, pp. 2570-2575 (2013).

Yonkee et al., "Demonstration of low resistance ohmic contacts to p-type (20-2-1) GaN," Semicond. Sci. Technol., vol. 30, No. 7, p. 75007, 2015.

Yonkee et. al., "Silver free III-nitride flip chip light emitting diode with wall plug efficiency over 70% utilizing a GaN tunnel junction," Applied Physics Letters, vol. 109, Issue 19, id.191104.

Young et al., "Hybrid tunnel junction contacts to III-nitride light-emitting diodes". Appl. Phys. Express. 9, 022102-1 to 022102-4 (2016).

\* cited by examiner

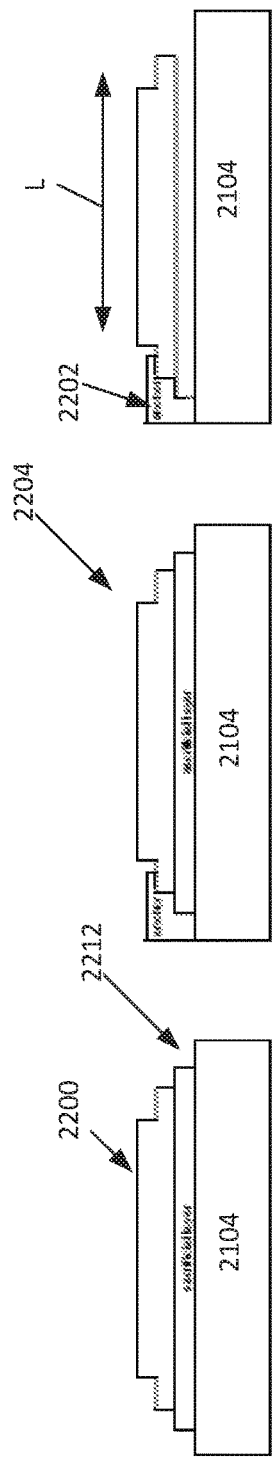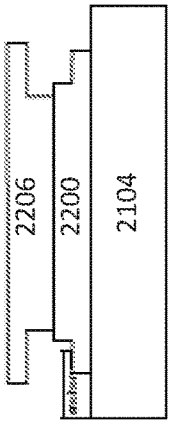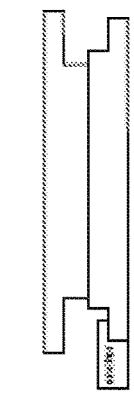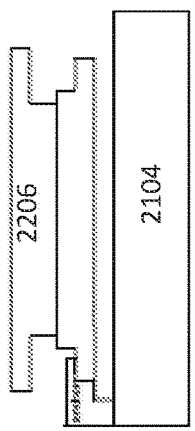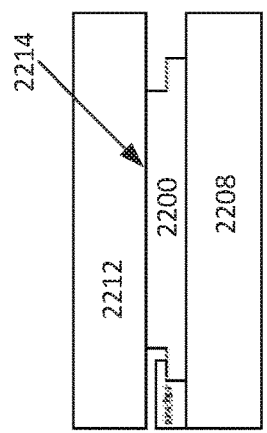

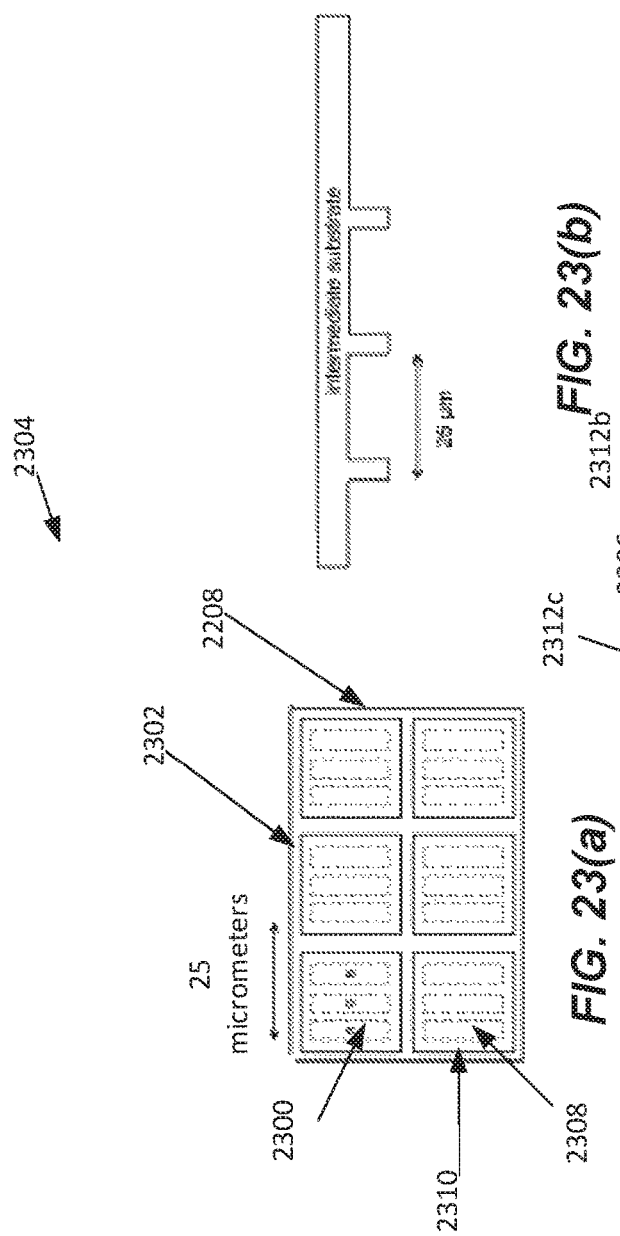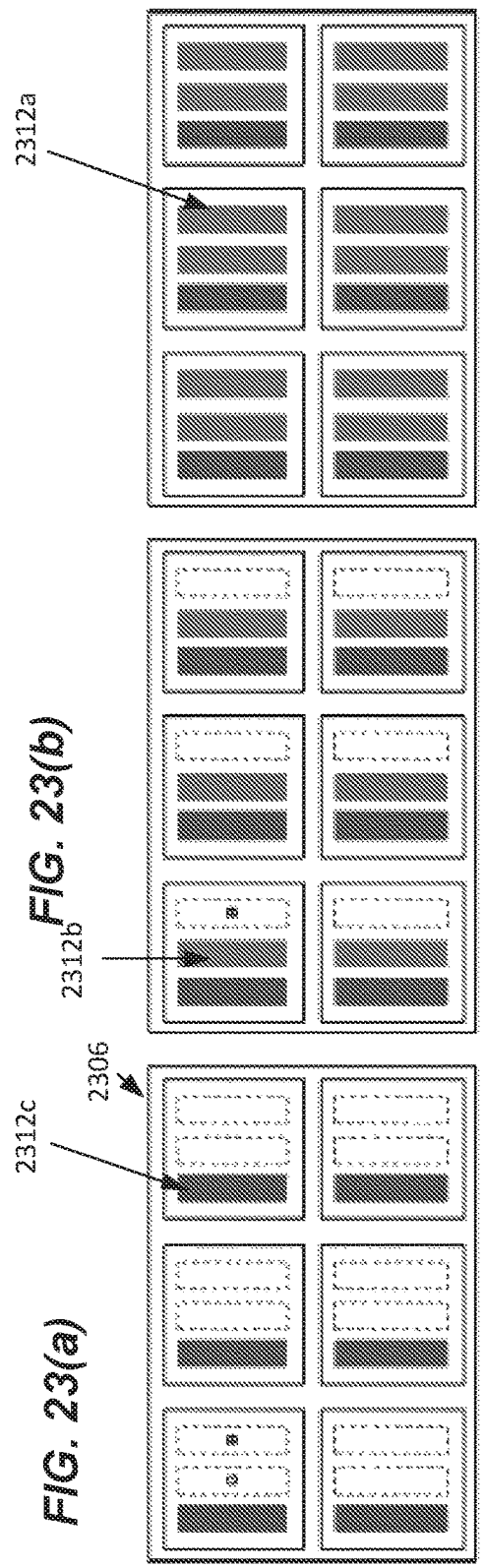
FIG. 23(a)
FIG. 23(b)
FIG. 23(c)
FIG. 23(d)
FIG. 23(e)

METHODS FOR FABRICATING III-NITRIDE TUNNEL JUNCTION DEVICES

CROSS REFERENCE TO RELATED APPLICATIONS

This application claims the benefit under 35 U.S.C. Section 119(e) of the following and commonly-assigned applications:

U.S. Provisional Patent Application No. 62/376,307, filed on Aug. 17, 2016, by Benjamin P. Yonkee, Asad Mughal, Steven P. DenBaars, and Shuji Nakamura, entitled "SPUTTER DEPOSITION METHOD FOR III-NITRIDE TUNNEL JUNCTION DEVICES,"

U.S. Provisional Patent Application No. 62/376,201, filed on Aug. 17, 2016, by Benjamin P. Yonkee, Erin C. Young, James S. Speck, Steven P. DenBaars and Shuji Nakamura, entitled "III-NITRIDE TUNNEL JUNCTION IMPROVEMENT THROUGH REDUCTION OF THE MAGNESIUM MEMORY EFFECT,"

U.S. Provisional Patent Application No. 62/491,493, filed on Apr. 28, 2017, by Asad J. Mughal, David Hwang and Steven P. DenBaars, entitled "MOCVD REGROWTH DEPOSITION METHOD FOR III-NITRIDE TUNNEL JUNCTION DEVICES,"

U.S. Provisional Patent Application No. 62/414,385, filed on Oct. 28, 2016, by David Hwang, Steven P. DenBaars, James S. Speck and Shuji Nakamura entitled "SELF EMISSIVE III-V MICRO LED-BASED DISPLAYS USING LOW RESISTANCE TUNNEL JUNCTIONS,"

all of which applications are incorporated by reference herein.

This application is related to the following co-pending and commonly-assigned U.S. patent applications:

International PCT Application No. PCT/US17/16720 filed Feb. 6, 2017, entitled III-NITRIDE LIGHT EMITTING DIODES WITH TUNNEL JUNCTIONS WAFER BONDED TO A CONDUCTIVE OXIDE AND HAVING OPTICALLY PUMPED LAYERS, by Asad J. Mughal, Stacy J. Kowsz, Robert M. Farrell, Benjamin Yonkee, Erin C. Young, Christopher D. Pynn, Tal Margalith, James S. Speck, Shuji Nakamura, and Steven P. DenBaars, which application claims the benefit under 35 U.S.C Section 119(e) of the following co-pending and commonly-assigned applications:

U.S. Provisional Application Ser. No. 62/292,015, filed on Feb. 5, 2016, by James S. Speck, Asad Mughal, Erin C. Young, and Steven P. DenBaars, entitled "LIGHT EMITTING DIODE WITH A TUNNEL JUNCTION CONTACT WAFER BONDED TO A CONDUCTIVE OXIDE,"

U.S. Provisional Application Ser. No. 62/298,268, filed on Feb. 22, 2016, by Stacy J. Kowsz, Robert M. Farrell, Benjamin Yonkee, Erin C. Young, Christopher D. Pynn, Tal Margalith, Shuji Nakamura, and Steven P. DenBaars, entitled "TUNNEL JUNCTION DEVICES WITH MONOLITHIC OPTICALLY-PUMPED AND ELECTRICALLY-INJECTED III-NITRIDE LAYERS,"

PCT International Utility Patent Application Serial No. PCT/US16/59929, filed on Nov. 1, 2016, by Benjamin P. Yonkee, Erin C. Young, John T. Leonard, Tal Margalith, James S. Speck, Steven P. DenBaars, and Shuji Nakamura entitled III-NITRIDE TUNNEL JUNCTION WITH MODIFIED P-N INTERFACE, which application claims the benefit under 35 U.S.C. § 119 of U.S. Provisional Patent Application No. 62/250,758, filed on Nov. 4, 2015, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE"

PCT International Utility Patent Application Serial No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES,"

all of which applications are incorporated by reference herein.

BACKGROUND OF THE INVENTION

1. Field of the Invention

This invention relates to a sputter deposition method for III-nitride tunnel junction devices.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

A number of techniques have been used for improving the performance of semipolar III-nitride optoelectronic devices. The term "III-nitrides" refers to any alloy composition of the (Al,Ga,In,B)N semiconductors having the formula $Al_w Ga_x In_y B_z N$, where $0 \leq w \leq 1$, $0 \leq x \leq 1$, $0 \leq y \leq 1$, $0 \leq z \leq 1$, and $w+x+y+z=1$. The term "semipolar" refers generally to any plane of the III-nitride crystal that is not a polar or nonpolar plane, and more specifically, to any plane that has at least two nonzero h, i, or k Miller indices and a nonzero l Miller index, such as the 20-21 plane.

Current commercially-available m-nitride light-emitting diodes (LEDs) and edge-emitting laser diodes (EELDs) use an active region in a biased p-n junction to allow for electron and hole injection. However, p-type gallium nitride (p-GaN) is difficult to contact electrically, and has low hole concentration and mobility. This means that p-GaN cannot be used as a current spreading layer and that traditional p-contacts will add significant voltage to devices. Despite these inherent problems, all commercial light emitting devices utilize traditional p-contacts and materials other than p-GaN for current spreading, which typically comprise transparent conducting oxides (TCO), such as indium tin oxide (ITO).

A low resistance tunnel junction on top of p-GaN would allow for current spreading in n-type GaN (n-GaN) on both sides of the device, as well as the use of low resistance n-type contacts on both sides of the device. A tunnel junction is a diode comprised of a very highly doped ($n^+/p^+$) interface that allows for electrons to tunnel between the valence band and conduction band. This was first demonstrated by Esaki [1] in highly-doped Ge homojunctions with very thin depletion regions.

In principle, a highly doped Esaki-type homojunction diode should provide the lowest-loss tunnel junction. However, there have been a number of difficulties in achieving high quality tunnel junctions in the GaN material system.

For example, GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses, either in terms of voltage or resistance increases, or optical losses in the final device performance.

In another example, magnesium (Mg) doped p-GaN grown by metal-organic chemical vapor deposition (MOCVD) is compensated by hydrogen as grown, and it must be annealed after growth to remove the hydrogen. This anneal can only work if the p-GaN is not covered by n-GaN, as hydrogen cannot easily diffuse through n-GaN. This limits the effectiveness of tunnel junctions and prevents their widespread use.

Thus, there is a need in the art for structure for improving the performance of III-nitride devices. The present invention satisfies this need.

SUMMARY OF THE INVENTION

To overcome the limitations in the prior art described above, and to overcome other limitations that will become apparent upon reading and understanding this specification, the present invention discloses a sputter deposition method for III-nitride tunnel junction devices, wherein metal-organic chemical vapor deposition (MOCVD), which may be plasma MOCVD, is used to grow one or more light-emitting or light-absorbing structures, and electron cyclotron resonance (ECR) sputter deposition is used to grow one or more tunnel junctions. By combining MOCVD grown light emitters or absorbers and ECR sputter deposited tunnel junctions, the operating voltage of these devices could be reduced and their efficiency could be increased, as well as enabling new types of device structures, including new types of light-emitting diodes (LEDs), vertical cavity surface emitting lasers (VCSELs), edge-emitting laser diodes (EE-LDs), and solar cells. For example, the tunnel junctions could be used to incorporate multiple active regions into a single device, which could increase performance of EELDs and VCSELs by providing additional gain, or reduce the droop in LEDs by achieving more light at the same current density. In addition, n-type GaN (n-GaN) can be used as a current spreading layer on both sides of the device, eliminating the need for a TCO layer or a silver (Au) mirror. The use of low resistance n-contacts on both sides of the device would be especially useful for lasers where the main resistance comes from the p-contacts. In addition, since sputter deposition tools are commonly used in semiconductor processing on an industrial scale, this method of forming III-nitride tunnel junctions can be readily commercialized.

In one or more further embodiments, a wet chemical treatment to improve the performance of a III-Nitride tunnel junction. In one or more embodiments, after the p-type layer is grown, an ex situ chemical treatment is used to remove the excess magnesium.

In one or more further embodiments, a method for fabricating III-nitride tunnel junction devices comprises using MOCVD (e.g., plasma MOCVD) to grow one or more light-emitting or light-absorbing structures, the p-GaN is activated, either in situ or ex situ, and an additional MOCVD regrowth is used to grow one or more tunnel junctions on or above the light-emitting or light-absorbing structures. After etching a mesa structure in which one or more lateral dimensions are on the order of or below about 200 μm, any p-GaN that may be re-passivated by hydrogen at elevated temperatures can be reactivated by either an in situ or ex situ anneal through the lateral diffusion of hydrogen.

By combining MOCVD grown light emitters or absorbers and additional MOCVD deposited tunnel junction layer(s), the operating voltage of these devices could be reduced and their efficiency could be increased, as well as enabling new types of device structures, including new types of LEDs, micro LED displays, vertical cavity surface emitting lasers (VCSELs), EELDs, and solar cells. For example, the tunnel junctions could be used to incorporate multiple active regions into a single device, which could increase performance of EELDs and VCSELs by providing additional gain, or reduce the droop in LEDs by achieving more light at the same current density.

In addition, n-GaN can be used as a current spreading layer on both sides of the device, eliminating the need for a TCO layer or a silver (Ag) mirror. The use of low resistance n-contacts on both sides of the device would be especially useful for lasers where the main resistance comes from the p-contacts.

In addition, since MOCVD tools are commonly used in semiconductor processing on an industrial scale, this method of forming III-nitride tunnel junctions can be readily commercialized.

In yet further embodiments, the present invention discloses methods for fabricating and assembling self-emissive inorganic III-V micro-LED based displays using low-resistance tunnel junctions. The methods fabricate and assemble display pixels from the inorganic III-V compound semiconductor micro devices by: a hybrid epitaxial growth of III-V layers on a first host substrate using both MOCVD and molecular beam epitaxy (MBE) to form the devices with tunnel junctions; forming patterns and mesas on the micro devices; affixing select areas of the devices onto the substrate through patterning of the epitaxial material or through addition of other materials; undercutting the devices with a photoelectrochemical (PEC) etch or laser-liftoff (LLO), so as to partially separate the devices from the substrate; transfer printing by attaching an intermediate substrate as a transfer medium to the surfaces of the devices; mechanically fracturing the material affixing the devices to the host substrate; bonding the separated devices to a second substrate; and removing the transfer medium, so that the devices effectively have been transferred from the host substrate onto the second substrate. A third substrate including interconnection patterns may be bonded to exposed surfaces of the transferred devices.

BRIEF DESCRIPTION OF THE DRAWINGS

Referring now to the drawings in which like reference numbers represent corresponding parts throughout:

FIGS. 22(a)-22(h) are schematics that illustrate the fabrication method of the present invention.

FIGS. 23(a)-23(e) are schematics that illustrate the assembly method of the present invention.

DETAILED DESCRIPTION OF THE INVENTION

Figure 1:
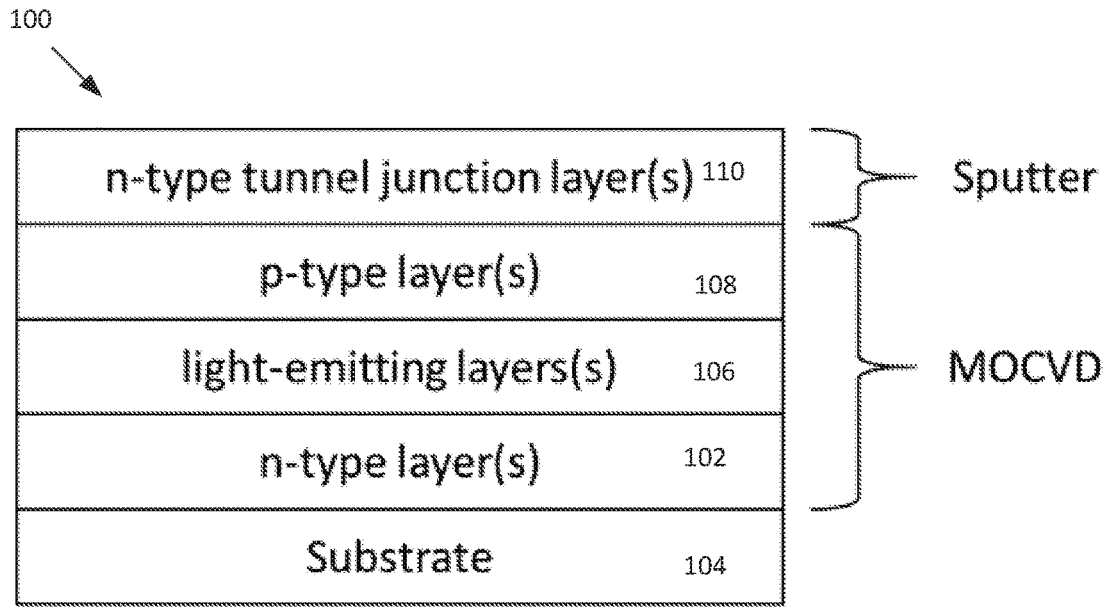
FIG. 1 is a schematic of an epitaxial structure for a sputter deposited tunnel junction grown on an MOCVD LED, wherein the layers of the structure are annotated by the sputter or MOCVD growth technique to the right of the layers.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

A. Physical Vapor Deposition (e.g. Sputter Deposition) Method for III-Nitride Tunnel Junction Devices As noted above, the present invention comprises a sputter deposition method for r-nitride tunnel junction devices that uses MOCVD to grow one or more light-emitting or light-absorbing structures and sputter deposition is used to grow one or more tunnel junctions.

Tunnel junctions grown by MOCVD are difficult to achieve, because the as-grown Mg-doped layers are insulating due to hydrogen passivation, and are typically activated by a post growth anneal. If a tunnel junction is grown by MOCVD, the p-GaN cannot be activated, because hydrogen will not diffuse through the top n-GaN layer if it is too thick. It is also difficult to produce well defined junctions, because of a phenomena known as the Mg memory effect [5]. The Mg memory effect causes the surface of p-GaN to have a high concentration of Mg, which has been shown to diffuse into subsequent MOCVD regrowth layers [6] due in part to the high temperatures required to grow GaN using MOCVD.

Sputter deposition is a type of physical vapor deposition (PVD) method used to form thin films of various materials and microstructures. This is achieved by bombarding a target material with ionized atoms of an inert gas, such as argon, or a reactive gas, such as oxygen or nitrogen. As a result of this bombardment, atoms of the target material are ejected and transported in the gas phase onto a substrate where they condense and form a thin film. The source of these ions is typically from a plasma which is formed by applying a large negative potential to a cathode (i.e., the target material) under high vacuum conditions [7]. The plasma is sustained in part due to the formation of secondary electrons produced during interactions between ions and the target surface. The ionization process can be enhanced through the use of magnetic fields in magnetron sputtering systems. The plasma is typically generated using either a radio frequency (RF), direct current (DC), or pulsed DC power supply [8].

Although there exist several demonstrations of sputter deposited GaN thin films, they have yet to be shown to behave as tunnel junction contacts to p-GaN [9]-[11]. This is in part due to the fact that p-GaN is quite sensitive to plasma damage, since most sputtering techniques expose the surface of the substrate (i.e., p-GaN layer) to the same plasma that is used to bombard the target [12], [13]. The solution to this issue is either to protect the p-GaN from this type of damage, or minimize its exposure to the plasma. An alternative sputtering approach is to generate the plasma remotely in order to minimize its negative effects on the p-GaN surface. One technique to achieve this is to use electron cyclotron resonance (ECR) plasma sources. In this case microwave power is coupled to the plasma at the ECR frequency in order to produce high energy electrons which ionize the neutral input gas to produce and maintain a dense, low pressure plasma with a high degree of ionization [14]. This process produces low energy ions which mitigate plasma damage [15]. ECR plasmas are typically used with gaseous precursors in chemical vapor deposition (CVD) systems. Solid source ECR plasma deposition methods also exist and have yielded high quality epitaxial ITO [16] and AlN [17] thin films.

By using ECR plasma deposition to grow the n-GaN layer on top, the p-GaN remains activated while being buried beneath the n-GaN. This could allow for the regrowth of additional LED epitaxial layers by MOCVD on top of the first LED, because the hydrogen cannot diffuse through the top n-GaN layer.

In addition to the tunnel junction LEDs described above, the present invention can also be applied to VCSELs, which have a long history of prior art dating back to the 1970's [18]. III-nitride VCSELs represent a new class of VCSELs that represent a new set of unique challenges and device designs compared to conventional III-arsenide VCSELs [19]. The present invention provides a regrowth technique for achieving high quality III-nitride tunnel junction intracavity contacts in III-nitride VCSELs.

FIGS. 1-4 are schematics that show possible epitaxial structures comprising III-nitride layers, growth methods, and repeat sequences. The method for growing the layers is indicated as being a sputter or MOCVD growth method, and any repeat sequence the layers is also indicated.

FIG. 1 illustrates an epitaxial structure 100 comprising one or more n-type layers 102 on a substrate 104, one or more light emitting layers 106 on the one or more n-type layers 102, one or more p-type layers 108 on the one or more light emitting layers 106, and one or more n-type tunnel junction layers 110 on the one or more p-type layers 108. Layers 102, 106, and 108 are grown by MOCVD and layer(s) 110 is deposited using sputter deposition.

Figure 2:
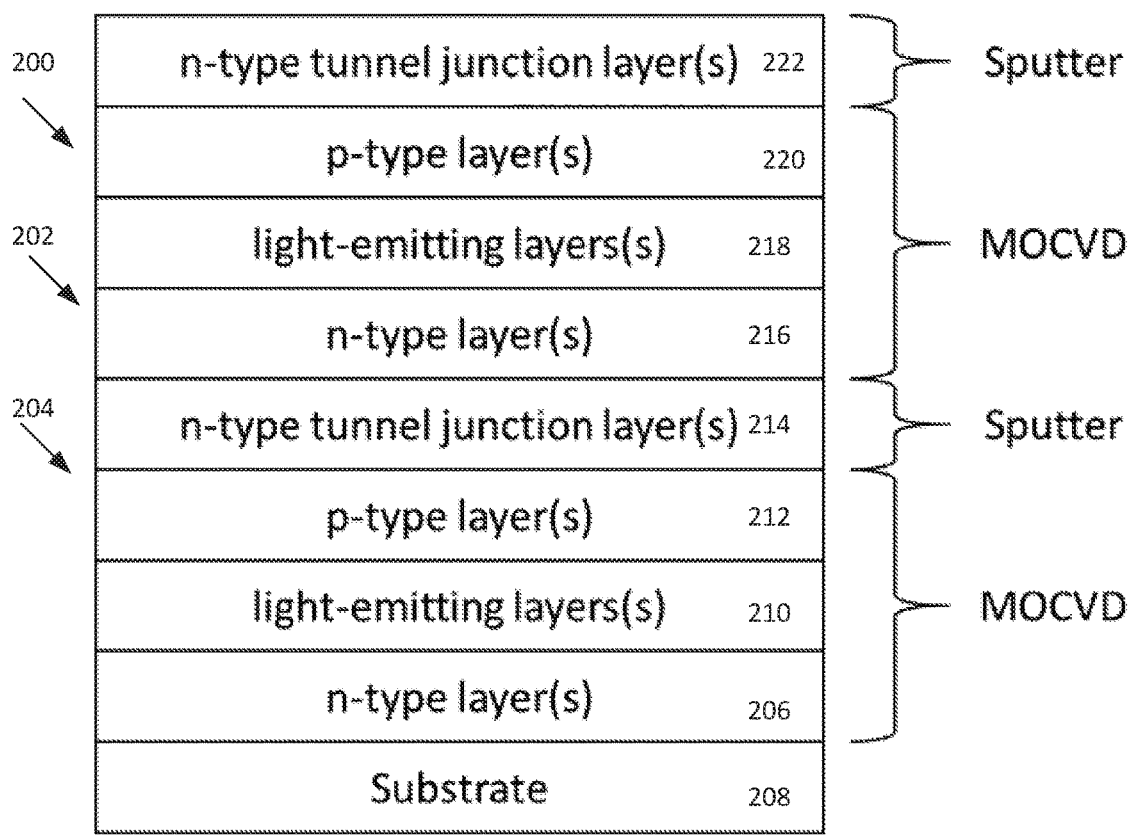
FIG. 2 is a schematic of an epitaxial structure for a double junction MOCVD LED with a sputter deposited tunnel junction sandwiched therebetween, wherein the layers of the structure are annotated by the sputter or MOCVD growth technique to the right of the layers.

FIG. 2 illustrates an epitaxial structure 200 comprising a second epitaxial structure 202 on a first epitaxial structure 204. The first epitaxial structure 204 comprises one or more first n-type layers 206 on a substrate 208, one or more first light emitting layers 210 on the one or first more n-type layers 206, one or more first p-type layers 212 on the one or more first light emitting layers 210, and one or more first n-type tunnel junction layers 214 on the one or more p-type layers 212. Layers 206, 210, and 212 are grown by MOCVD and layer(s) 214 are deposited using sputter deposition. The second epitaxial structure 202 comprises one or more second n-type layers 216 on layer(s) 214, one or more second light emitting layers 218 on the one or second more n-type layers 216, one or more second p-type layers 220 on the one or more second light emitting layers 218, and one or more second n-type tunnel junction layers 222 on the one or more p-type layers 220. Layers 216, 218, and 220 are grown by MOCVD and layer(s) 222 are deposited using sputter deposition.

Figure 3:
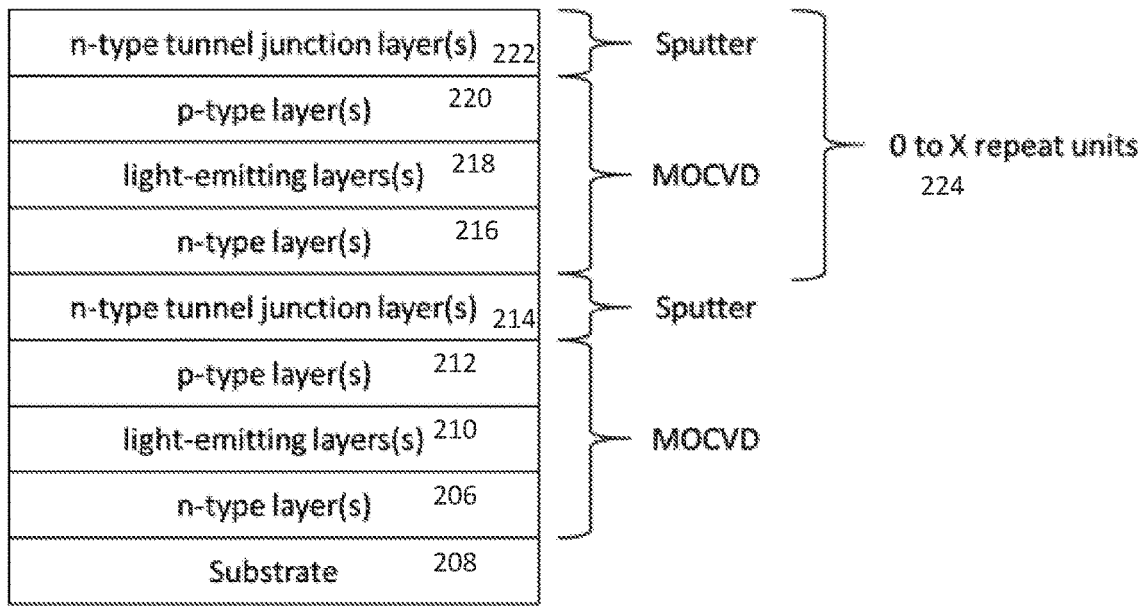
FIG. 3 is a schematic of an epitaxial structure for a multi junction MOCVD LED with a sputter deposited tunnel junction sandwiched therebetween, wherein the layers of the structure are annotated by the sputter or MOCVD growth technique and repeat sequence to the right of the layers.

FIG. 3 shows an epitaxial structure wherein further epitaxial structures are deposited on the second epitaxial structure 202 so as to form 0 ... X repeat units 224 of the epitaxial structure 202, where X is an integer.

Figure 4:
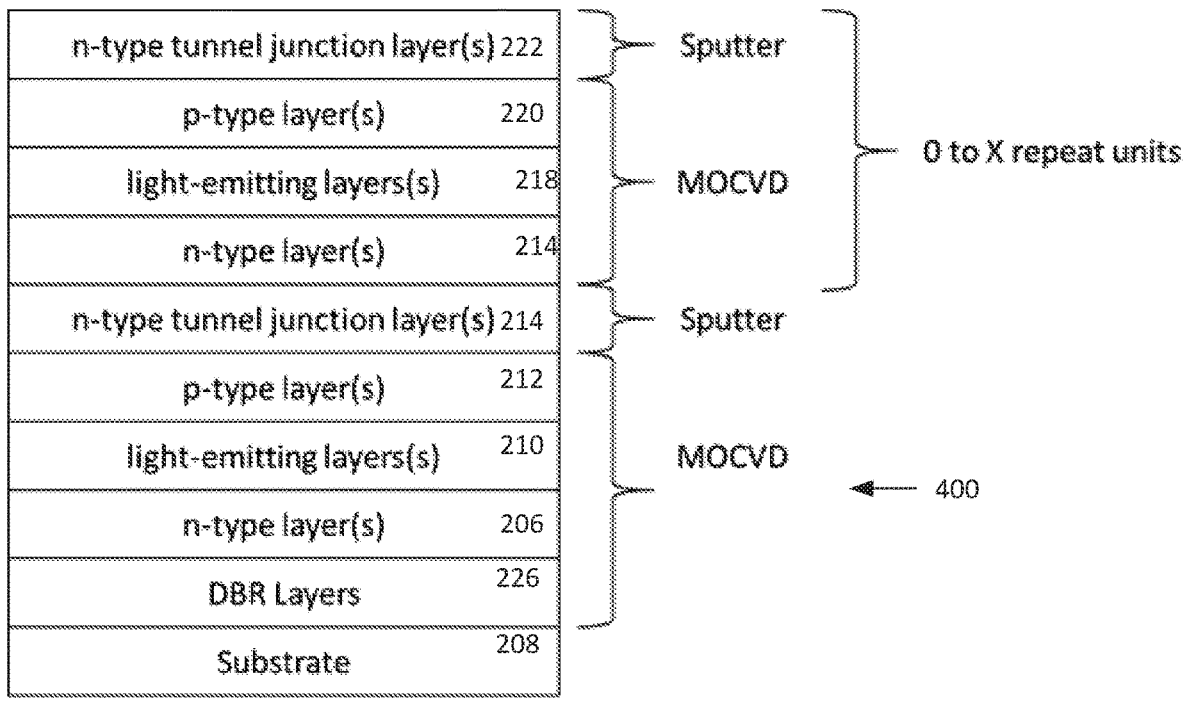
FIG. 4 is a schematic of an epitaxial structure for a VCSEL employing sputter deposited tunnel junction intracavity contacts, wherein the III-nitride layer types of the structure are annotated by the sputter or MOCVD growth method and repeat sequence to the right of the layers.

FIG. 4 shows one or more regrown ECR sputtered tunnel junctions used in a VCSEL laser structure 400, wherein the ECR sputter deposited tunnel junction are intracavity contacts.

In the design of FIG. 4, the VCSEL 400 includes a substrate 208, followed by Distributed Bragg reflectors (DBRs) layers 226, n-type layers(s) 206, light-emitting layer(s) 210, and p-type layer(s) 212 grown by MOCVD, followed by n-type tunnel junction layer(s) 214 grown by ECR sputter deposition, followed by n-type layers(s) 216, light-emitting layer(s) 218, and p-type layer(s) 220 grown by MOCVD, followed by n-type tunnel junction layer(s) 222 grown by ECR sputter deposition. The final MOCVD and sputter steps may be repeated to form multiple repeat units 224 (0 ... X), where X is an integer.

The order of the epitaxial layers shown in the design in FIG. 4 makes the structure appropriate for fabricating a flip-chip VCSEL using laser lift-off of the native substrate 208 and dielectric layers for the n-side and p-side DBRs (i.e., dual dielectric DBRs). By growing and increasing the number of the repeat units 224 as shown, a device can be made with a cascade of active regions 210, 218 aligned to peaks of the cavity mode in the finished device. The order of the epitaxial layers shown in these designs makes these structures appropriate for fabricating VCSELs employing epitaxially grown DBRs on the p-side and n-side (dual epitaxial DBRs) or an epitaxial DBR on the n-side and a dielectric DBR on the p-side (hybrid DBRs). Only the layers that comprise the epitaxial growth process are shown (i.e., no dielectric or metal layers are shown). In one or more embodiments, a light-absorbing layer is included in the structure 400 to monitor the emitted power from the light-emitting region(s) 210, 218, wherein the structure does or does not include a tunnel-junction cap 222, or the light-absorbing layer is grown before the light-emitting layers 210, 218.

Although p-type layers 108, 212 and 220 are indicated being grown by MOCVD, in one or more embodiments, the p-type layers 108, 212 and 220 are deposited by sputtering.

In one or more embodiments, n-type tunnel junction layer(s) 110, 222, 214 further comprise p-type material forming an interface with n-type material and the underlying p-type layer 108, 220, 212.

Process Steps

Figure 5:
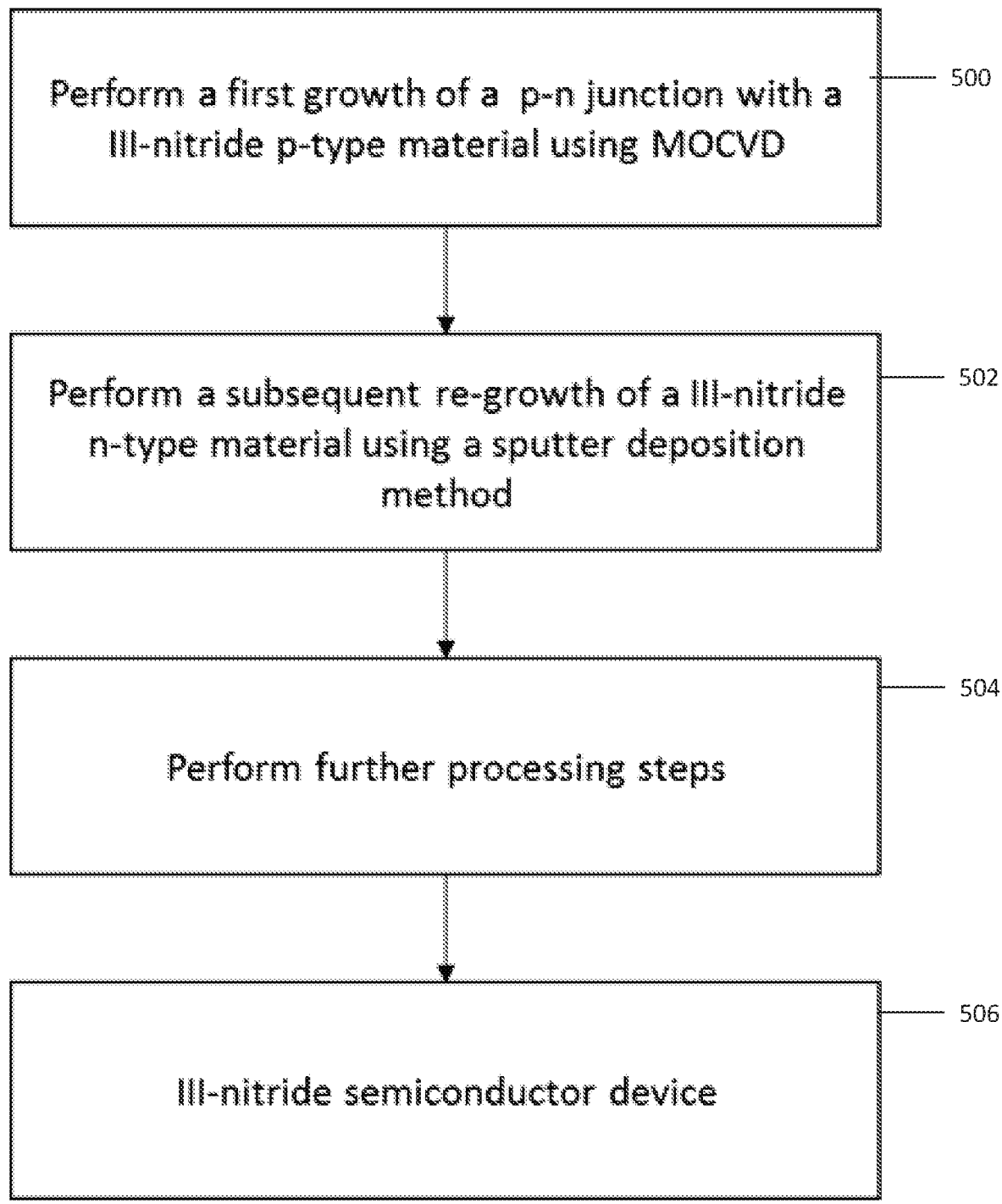
FIG. 5 is a process flow diagram for forming an n-GaN tunnel junction to p-GaN on a III-nitride semiconductor device.

FIG. 5 is a process flow diagram for forming a n-GaN tunnel junction with p-GaN in a III-nitride semiconductor device (referring also to FIG. 1, FIG. 2, FIG. 3, and FIG. 4).

Block 500 represents performing a first growth of a p-n junction comprising a III-nitride p-type material and/or layer 212, 108, an n-type III-nitride material and/or layer 102, 206, and an active region 106, 210 on the n-type III-nitride material layer 102, 206 and between the n-type III-nitride material 102, 206 and III-nitride p-type material 212, 108.

In one or more embodiments, the n-type III-nitride material and/or layer 206, 102, the first active region 106, 210, and III-nitride p-type material and/or layer 212, 108 are grown by MOCVD.

Block 502 represents performing a subsequent regrowth of a III-nitride n-type material 214, 110 using a sputter deposition method.

In one or more embodiments, the subsequent regrowth of III-Nitride based material 214, 110 using sputter deposition prevents passivation of the activated MOCVD grown p-type III-Nitride based material 212, 108.

In one or more embodiments, the subsequent regrowth forms a tunnel junction 110 with the p-type III-nitride material 212, 108.

In one or more embodiments, the p-type III-nitride material 108, 212 and the tunnel junction 214, 110 are grown using sputter deposition.

In one or more embodiments, only the n-type layer 206, 102 and the first active region 106, 210 are grown using MOCVD in Block 500, and the p-type region 212 and the tunnel junction 214 are grown by the sputtering deposition technique involving vacuum deposition in Block 502.

In one or more embodiments, the subsequent regrowth 214, 110 includes growth of a second (e.g., highly doped) III-nitride p-type material 618 to reduce contact resistance (e.g., of the tunnel junction 110). In one or more embodiments, the second III-nitride p-type material has a higher p-type dopant concentration than the p-type III-nitride material 212, 108 forming the p-n junction.

In one or more embodiments, the subsequent regrowth 214, 110 ends with an n-type material having a thickness between about 1 nm to about 500 nm thick, allowing for the protection of the activated p-GaN 212 108 (in the p-n junction) from ion damage.

In one or more embodiments, the subsequent regrowth 214, 110 includes growth of second n-type and second p-type material 618, and the tunnel junction is formed at a regrowth interface of the second n-type and second p-type material.

In one or more embodiments, delta-doping is used at the regrowth interface.

Block 504 represents further processing steps and/or growth steps, e.g., forming additional (e.g., III-nitride) active regions and repeat units 224. The additional active regions (e.g., second active region 218 can be with or without another set of n-type III-nitride 216 and/or p-type III-nitride layers 220.

In one or more embodiments, the first active region 210 is an active region for a first LED and the second active region 218 is an active region for a second LED of similar emission wavelength as the first LED, such that efficiency droop is reduced through use of multiple active regions.

In one or more embodiments, layers grown by performing another growth (e.g., second active region 218 in the repeat unit 224) emit electromagnetic radiation of similar wavelengths (to the first active region 210), and are aligned to peaks of a cavity mode in a VCSEL, such that each active region 210, 218 in the device structure 200 has large enhancement factors.

In one or more embodiments, a single metal contact deposition step is used to fabricate contacts to both n-type layers 110, 102 or 222, 214, and 206 of the device.

In one or more embodiments, a top n-GaN layer 222, 110 of the tunnel junction eliminates the need for a p-contact grid.

In one or more embodiments, each buried n-GaN layer 216, 206 is contacted, such that current flowing through each active region 210, 218 is controlled individually.

Block 506 represents the end result, a III-nitride semiconductor device.

In one or more embodiments, the first active region 210 is an active region for an LED, a VCSEL, or an edge-emitting laser diode (EELD), and the second active region 218 is a longer wavelength emitting single or multiple quantum well structure that is optically pumped by emission of a shorter wavelength from the first active region 210, the shorter wavelength shorter than the longer wavelength.

In one or more embodiments, the second active region 218 is an active region for LED, a VCSEL, or an EELD, and the first active region 210 is a longer wavelength emitting single or multiple quantum well structure that is optically pumped by emission of a shorter wavelength from the second active region 218, the shorter wavelength shorter than the longer wavelength.

In one or more embodiments, the longer wavelength emitting single or multiple quantum well structure is a photodiode used to monitor the emission of the shorter wavelength from the first 210 or second 218 active regions (the photodiode has an electromagnetic radiation sensitive region including the single or multiple quantum well structure).

In one or more embodiments, the first active region 210 is an active region for a LED and emitting a first emission wavelength, and the second active region 218 is an active region for an LED and emitting a different emission wavelength than the first emission wavelength.

In one or more embodiments, the device or device structure 200, 400 is a LED, a VCSEL, or an EELD device or device structure, and the top n-GaN layer of the tunnel junction 110, 222 serves as a current spreading layer.

In one or more embodiments, the device or device structure 200, 400 is an LED, a VCSEL, or an EELD device or device structure, and multiple embedded tunnel junctions 222, 214 (formed by repeat growths of repeat units 224) therein are used to screen or enhance polarization fields in active regions 210, 218 (multiple p-n junctions are separated by the embedded tunnel junctions 222, 214).

In one or more embodiments, the device or device structure is an LED, a VCSEL, or an EELD device structure, and the tunnel junction 222, 214,110 allows for use of a thin p-type material (e.g., thinner than in a device without the tunnel junction 222, 214, 110) to reduce electrical and optical losses in the p-type layers 108, 220, 212.

In one or more embodiments, the device or device structure 200, 100 is an LED device or device structure, and sheet resistances on both sides of the LED's p-n junction are matched to reduce current crowding.

In one or more embodiments, the device or device structure 200, 100 is an LED device or device structure comprising n-GaN layers, and (e.g., top and bottom) n-GaN layers 110, 102, or 206 and 222 in the device or device structure are roughened to increase an extraction efficiency of the LED device or device structure.

In one or more embodiments, the device or device structure 400 is a VCSEL processed in a flip-chip geometry with one or more high reflectivity optical coatings to enhance light extraction or confine an optical mode in the VCSEL device structure.

In one or more embodiments, the device is a multi-junction solar cell or photodiode.

In one or more embodiments, a single metal contact deposition step is used to fabricate contacts to both n-type layers 110, 102, or 206 and 222 of the device.

Subsequent Regrowth Techniques

In one or more embodiments, the subsequent regrowth 110, 222, 214 and/or deposition of p-type layer 108, 220, 212 is performed using at least one physical vapor deposition (e.g., sputtering technique) selected from electron cyclotron resonance (ECR) sputtering, direct current (DC) sputtering, radio frequency (RF) sputtering, direct current (DC) magnetron sputtering, radio frequency (RF) magnetron sputtering, direct current (DC) reactive sputtering, radio frequency (RF) reactive sputtering, direct current (DC) magnetron reactive sputtering, radio frequency (RF) magnetron reactive sputtering. Wherever sputtering is mentioned herein, PVD can be used. PVD includes, but is not limited to, ion beam deposition, electron or e-beam deposition, resistance heater deposition, sputter deposition, etc.

The subsequent regrowth and/or deposition of p-type layer 108, 220, 212 can further comprise ion beam-assisted deposition, ion beam deposition, and/or pulsed laser deposition.

The subsequent regrowth can use a n-type III-nitride target, a gallium (Ga) target, a gallium-silicon (Ga—Si)

alloy target, a gallium-germanium (Ga—Ge) alloy target, group III element metalorganic vapor precursors, vapor phase Si precursors, vapor phase Ge precursors, and/or a method different from MBE.

Advantages and Improvements

The present invention describes a method for depositing n-type GaN tunnel junction contacts to p-type GaN. The present invention's method of depositing n-type GaN tunnel junctions allows for the wide scale commercialization of tunnel junction technology in GaN opto-electronics.

REFERENCES FOR PART A

The following references above are relevant to this disclosure and are incorporated by reference herein.

[1] L. Esaki, "New Phenomenon in Narrow Germanium p-n Junctions," *Phys. Rev.*, vol. 109, no. 2, pp. 603-604, January 1958.
[2] J. Simon, V. Protasenko, C. Lian, H. Xing, and D. Jena, "Polarization-induced hole doping in wide-band-gap uniaxial semiconductor heterostructures.," *Science*, vol. 327, no. 5961, pp. 60-4, January 2010.
[3] S. Krishnamoorthy, F. Akyol, and S. Rajan, "InGaN/GaN tunnel junctions for hole injection in GaN light emitting diodes," *Appl. Phys. Lett.*, vol. 105, no. 14, p. 141104, October 2014.
[4] S. Krishnamoorthy, F. Akyol, P. S. Park, and S. Rajan, "Low resistance GaN/InGaN/GaN tunnel junctions," *Appl. Phys. Lett.*, vol. 102, no. 11, 2013.
[5] Y. Ohba and A. Hatano, "A study on strong memory effects for Mg doping in GaN metalorganic chemical vapor deposition," *ELSEVIER J. Cryst. Growth*, vol. 145, pp. 214-218, 1994.
[6] H. Xing, D. S. Green, H. Yu, T. Mates, P. Kozodoy, S. Keller, S. P. Denbaars, and U. K. Mishra, "Memory Effect and Redistribution of Mg into Sequentially Regrown GaN Layer by Metalorganic Chemical Vapor Deposition," *Jpn. J. Appl. Phys*, vol. 42, 2003.
[7] P. J. Kelly and R. D. Arnell, "Magnetron sputtering: a review of recent developments and applications."
[8] R. Keatch, "Principles of plasma discharges and material processing," *Microelectronics J.*, vol. 27, no. 8, p. 804, November 1996.
[9] T. Kikuma, K. Tominaga, K. Furutani, K. Kusaka, T. Hanabusa, and T. Mukai, "GaN films deposited by planar magnetron sputtering," *Vacuum*, vol. 66, no. 3-4, pp. 233-237, 2002.
[10] M. Junaid, C.-L. Hsiao, J. Palisaitis, J. Jensen, P. O. Å. Persson, L. Hultman, and J. Birch, "Electronic-grade GaN (0001)/Al2O3 (0001) grown by reactive DC-magnetron sputter epitaxy using a liquid Ga target," *Appl. Phys. Lett.*, vol. 98, no. 14, p. 141915, 2011.
[11] N. Elkashef, R. S. Srinivasa, S. Major, S. C. Sabharwal, and K. P. Muthe, "Sputter deposition of gallium nitride films using a GaAs target," *Thin Solid Films*, vol. 333, no. 1-2, pp. 9-12, 1998.
[12] X. A. Cao, A. P. Zhang, G. T. Dang, F. Ren, and S. J. Pearton, "Plasma Damage in p-GaN," *J. Electron. Mater.*, vol. 29, no. 3, pp. 256-261, 2000.
[13] S. J. Chang, C. H. Lan, J. D. Hwang, Y. C. Cheng, W. J. Lin, J. C. Lin, and H. Z. Chen, "Sputtered Indium-Tin-Oxide on p-GaN," *J. Electrochem. Soc.*, vol. 155, no. 2, p. H140, 2008.
[14] Z. Y. Ning, S. Y. Guo, and S. H. Cheng, "Numerical simulation of plasma flow downstream in an ECR plasma deposition apparatus," *Vacuum*, vol. 52, no. 3, pp. 219-223, March 1999.
[15] K. Xie, J. R Flemish, J. H. Zhao, W. R Buchwald, and L. Casas, "Low damage and residue-free dry etching of 6H-SiC using electron cyclotron resonance plasma," *Appl. Phys. Lett.*, vol. 67, no. 1995, p. 368, 1995.
[16] S. Kaneko, H. Torii, M. Soga, K. Akiyama, M. Iwaya, M. Yoshimoto, and T. Amazawa, "Epitaxial indium tin oxide film deposited on sapphire substrate by solid-source electron cyclotron resonance plasma," *Jpn. J. App. Phys.*, vol. 51, no. 1 PART 2, 2012.
[17] S. Kaneko, T. Ito, M. Yasui, M. Kurouchi, H. Torii, T. Amazawa, T. Tikumasu, T. Nagano, L. Seughwan, S. Park, and H. Takikawa, "Properties of epitaxial AlN thin film deposited on sapphire substrate by ECR plasma," 2013 *IEEE 6th Int. Conf Adv. Infocomm Technol. ICAIT* 2013, vol. 3, no. 0001, pp. 69-70, 2013.
[18] K. Iga, "Surface-Emitting Laser—Its Birth and Generation of New Optoelectronics Field," *IEEE J. Sel. Top. QUANTUM Electron.*, vol. 6, no. 6, 2000.
[19] D. F. Feezell, "Status and future of GaN-based vertical-cavity surface-emitting lasers," 2015, p. 93631G.

B. III-Nitride Tunnel Junction Improvement Through Reduction of the Magnesium Memory Effect There have been a number of difficulties in achieving high quality tunnel junctions in the GaN system. GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses either in terms of voltage or resistance increases, or optical losses in the final device performance. In principle, a highly doped Esaki type homojunction diode should provide the lowest-loss tunnel junction. However, magnesium doped p-GaN grown by Metal Organic Chemical Vapor Deposition (MOCVD) is compensated by hydrogen as grown, and it must be annealed after growth to remove hydrogen. This anneal can only work if the p-GaN is not covered by n-GaN as hydrogen cannot easily diffuse through n-GaN. This limits the effectiveness of tunnel junctions and prevents their widespread use. Unlike MOCVD grown p-GaN, MBE p-GaN is conductive as grown, which would allow for its use in a tunnel junction. Additionally, the doping limits of MBE materials are higher which could allow for better tunnel junctions. In a previous disclosure, [5] it was shown that by combining MOCVD grown light emitters and MBE grown tunnel junctions, one could reduce the operating voltage devices and increase the efficiency.

A very highly doped $(n^+/p^+)$ interface can allow for electrons to tunnel between the valence band of the p-type material and the conduction band of the n-type material. This was first demonstrated by Esaki in highly doped Ge homojunctions [1] with very thin depletion regions (this type of diode is also known as a tunnel junction). A low resistance tunnel junction could expand the design space of III-Nitride based LEDs, Edge Emitting Laser Diodes (EELDs), Vertical Cavity Surface Emitting Lasers (VCSELs), and multi junction solar cells, because a tunnel junction incorporated into these optoelectronic devices allows for the epitaxial structure of the device to use n-GaN on both sides, eliminating p-contacts and replacing them with lower resistance n-contacts. In addition, n-GaN can be used as an effective current spreading layer. The use of n-GaN for current spreading would allow for the elimination of a transparent conducting oxide (TCO) or silver mirror in an optoelectronic device design.

One or more embodiments of the present invention demonstrate the use of a multilayer dielectric high reflectivity (HR) coating combined with an aluminum reflector to form a mirror for a flip chip LED. This mirror does not form an electrical contact to the LED and can only be used because the regrown n-GaN layer can provide lateral current spreading.

An additional problem in creating III-Nitride tunnel junctions is the difficulty in achieving a sharp doping profile with magnesium. After the magnesium dopant source is turned off in a growth, the residual magnesium on the surface rides the surface as the crystal continues to grow and continues to dope the material. This is known as the magnesium memory effect. This present invention demonstrates a technique for reducing this effect, improving the performance of the tunnel junction.

Example Epitaxial Structure and Fabrication

Figure 6:
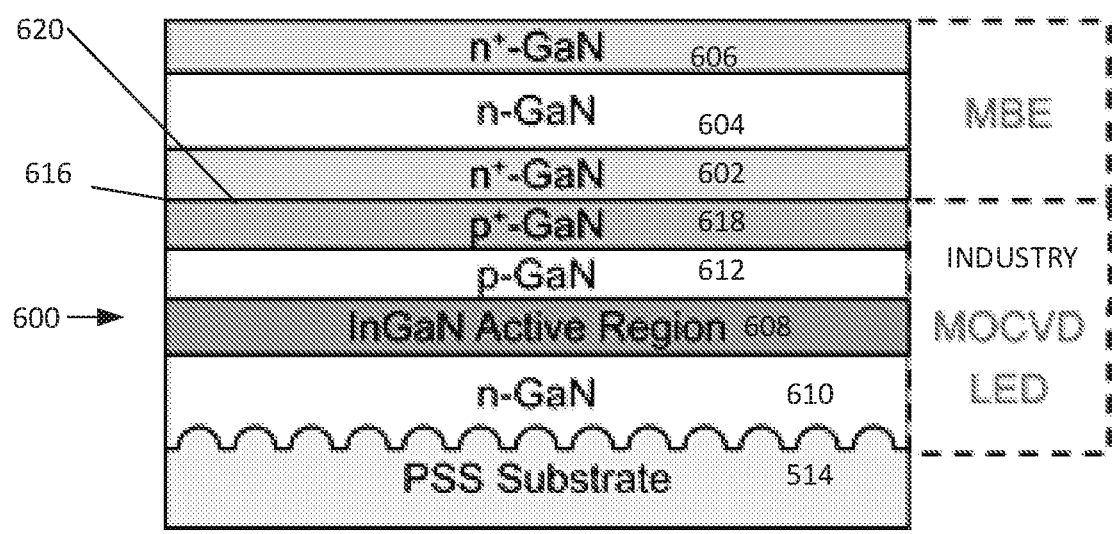
FIG. 6 illustrates the epi schematic utilized for the flip chip tunnel junction Light Emitting Diodes (LEDs).

FIG. 6 illustrates the epitaxial structure 600 for the LEDs and device design according to one or more embodiments of the invention. An MBE regrowth (comprising layers 602, 604, 606) is carried out on a standard MOCVD LED epitaxial structure (comprising InGaN active region 608 between n-GaN 610 and p-GaN 612) grown on a patterned sapphire substrate (PSS) 614 to produce a tunnel junction 616 between the MOCVD p+ layer 618 and the MBE regrown layer 602. One or more of the n-GaN 602, 604, 606 grown by MBE can then be used as a current spreading layer in optoelectronic devices. While the present invention discloses results for LED structures, the present invention can also be used in the fabrication of many III-Nitride devices.

Although layers 602, 604, 606, 612, 618, 610 are illustrated as comprising GaN, these layers may comprise different/other materials, such as other III-nitride materials. As used herein, an n+-layer is a layer having a higher n-type doping than an n-layer, and a $p^+$ layer is a layer having a higher p-type doping than a p-layer. Thus, n+-GaN has higher n-type doping than n-GaN, and p+-GaN has higher p-type doping than p-GaN.

Figure 7:
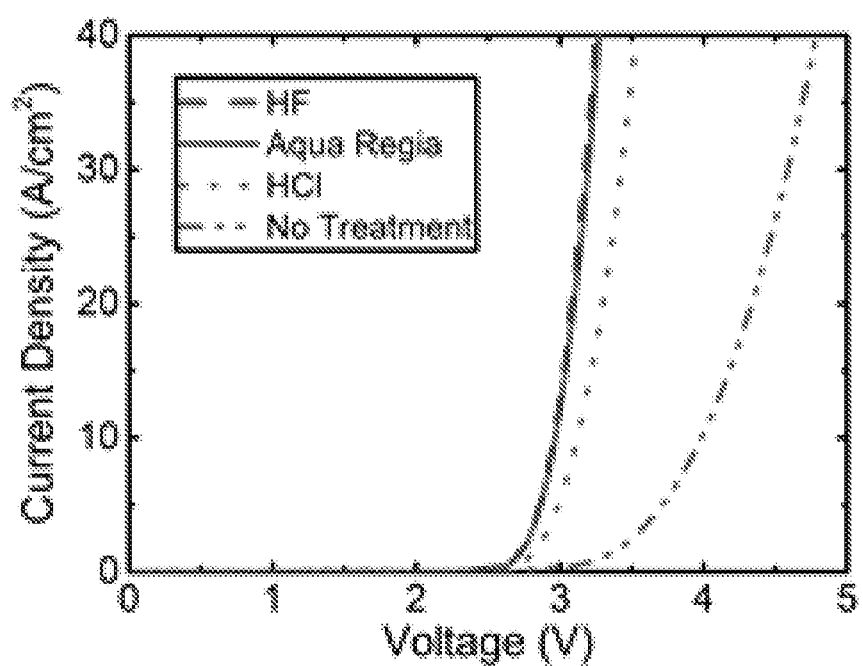
FIG. 7 shows the measured current-voltage curves for the LED having the structure of FIG. 6, after various acid treatments used to clean the surface before regrowth of the tunnel junction.
Figure 8A:
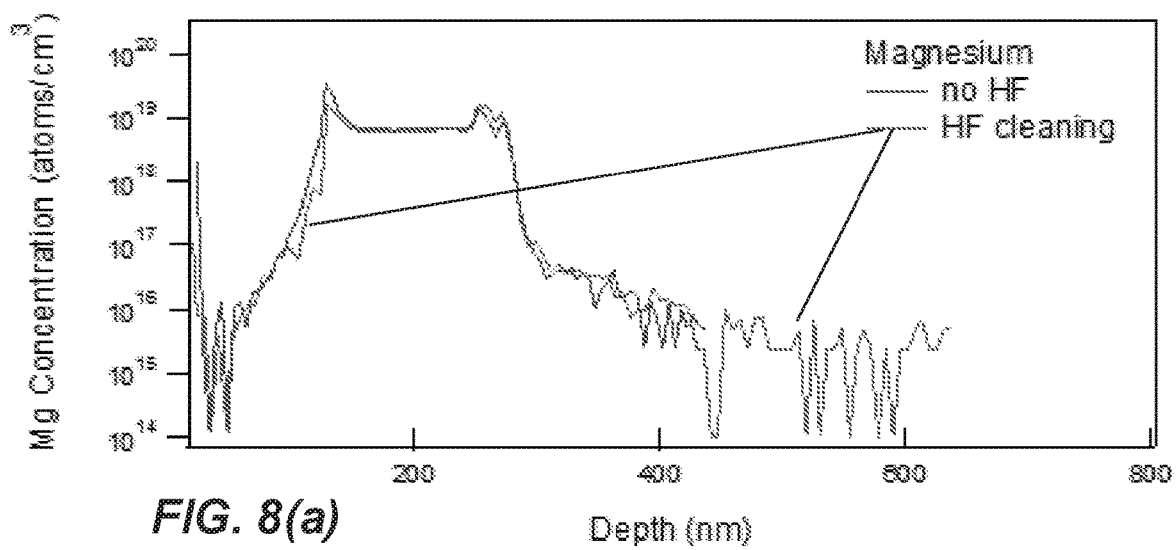
FIG. 8(a) shows Magnesium Secondary Ion Mass Spectrometry (SIMS) for a sample with and without HF cleaning.
Figure 8B:
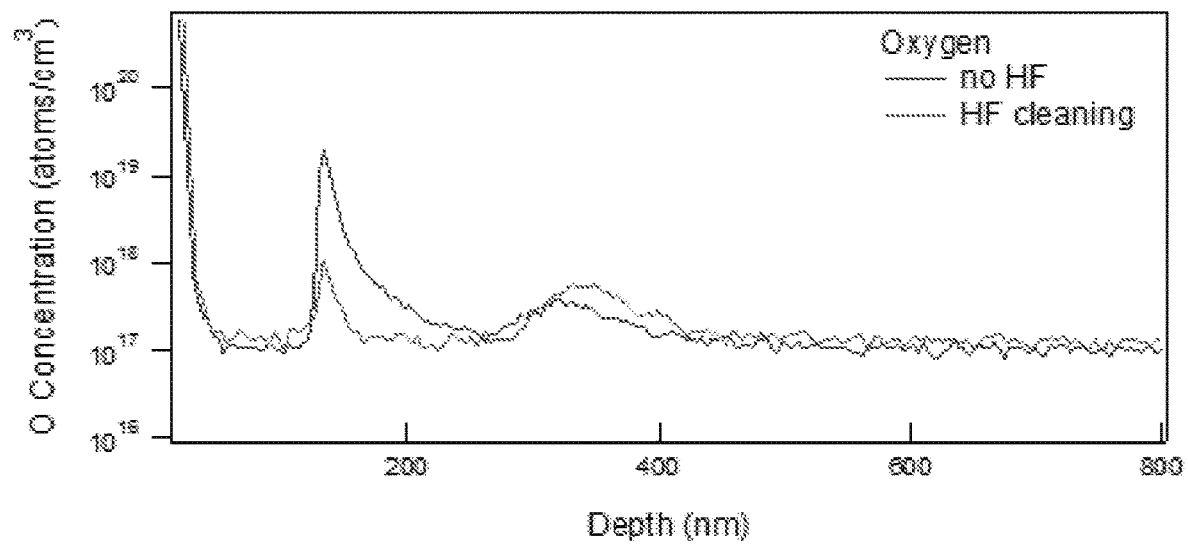
FIG. 8(b) shows Oxygen SIMS for the same samples as measured in FIG. 2(a).

Standard industrially grown blue LED wafers grown on patterned sapphire substrates were obtained. Before the MBE regrowth, the wafers were diced into small pieces and solvent cleaned. A 15 minute anneal in an $N_2/O_2$ atmosphere at 550° C. was carried out to activate the samples. Various acid treatments were used to clean the surface before regrowth 602 and the measured current-voltage (IV) curves are shown in FIG. 7. A Hydrofluoric acid (HF) dip was found to produce the lowest voltage for the tunnel junction regrowth 602. The samples were then indium bonded and loaded into a VEEECO 930 III-nitride MBE system equipped with an ammonia source. An in situ ammonia anneal was done at 600° C. to clean the surface. After heating to a growth temperature of 750° C., a 10 nm n+-GaN layer ([Si]: $2 \times 10^{20}$) 602 was grown to form the tunnel junction 616. The ammonia overpressure under the MBE growth conditions was low enough to prevent passivation of the p-GaN 612, 618 with hydrogen. For the transparent design, a 400 nm layer of n-GaN ([Si]: $2.9 \times 10^{19}$) 604 was then grown to act as a current spreading layer and an additional 5 nm n+-GaN layer 606 was grown for n-contacts.

Characterization

SIMS was done to investigate the effect of HF on the dopant profiles, and the results are plotted in FIGS. 8(a)-8(b), FIG. 9, and FIG. 10.

Figure 9:
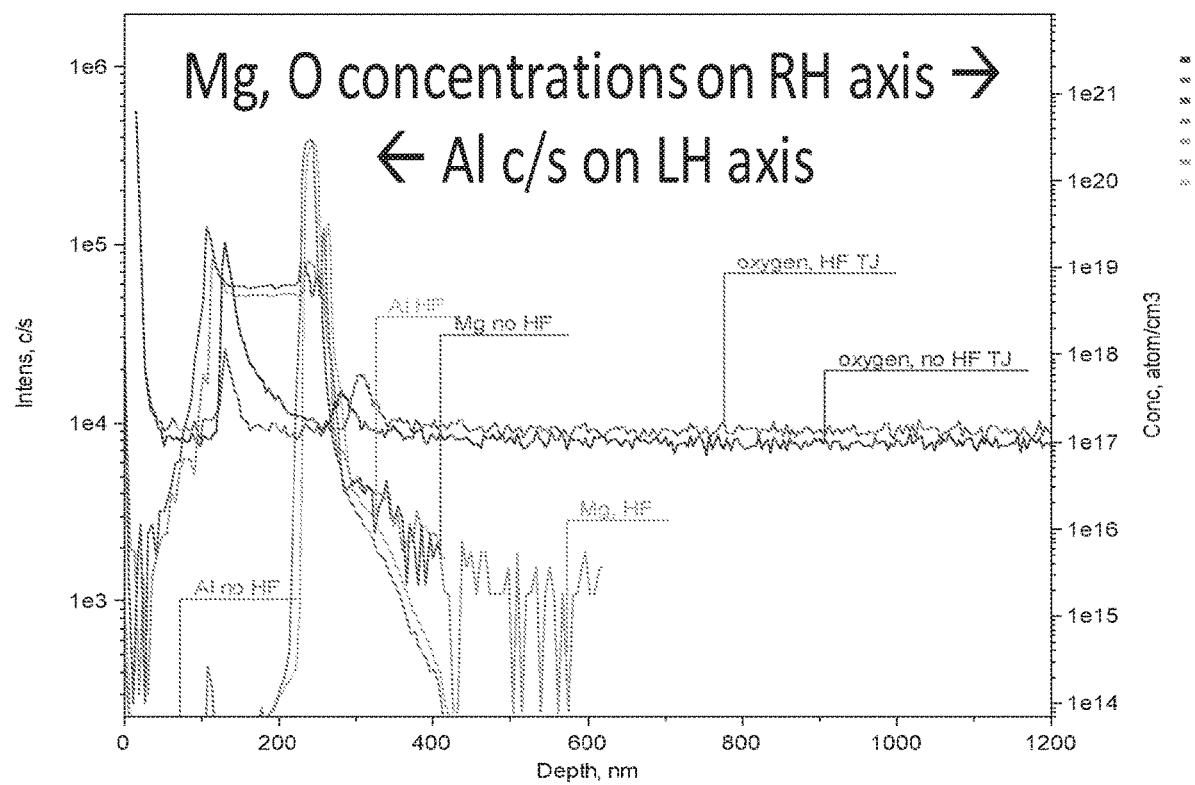
FIG. 9 shows SIMS data for tunnel junction regrowth with and without Hydrogen Fluoride (HF) clean.
Figure 10A:
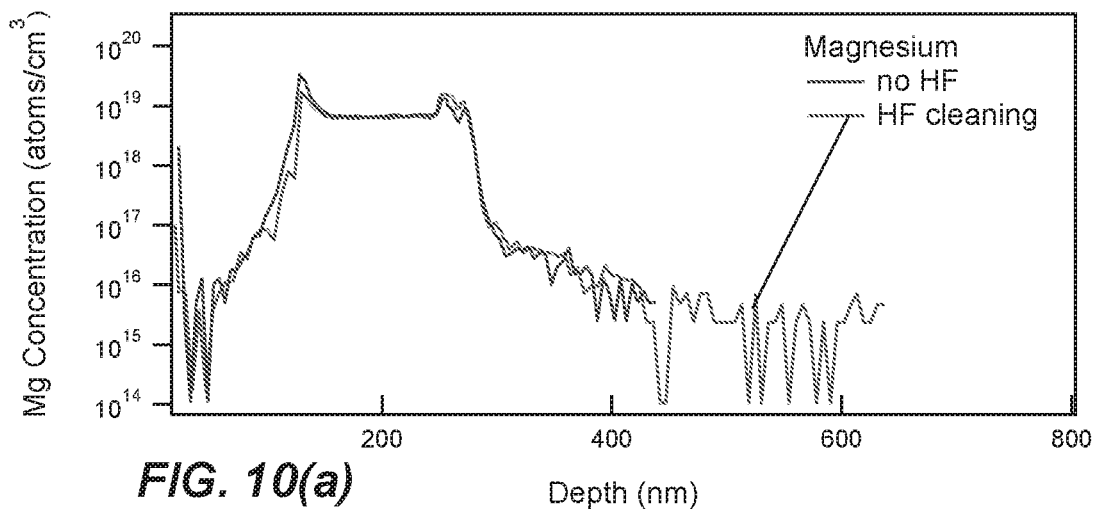
FIGS. 10(a)-10(c) show SIMS data plotting magnesium (Mg) concentration, oxygen (O) concentration, and silicon (Si) concentration for samples with and without HF cleaning.
Figure 10B:
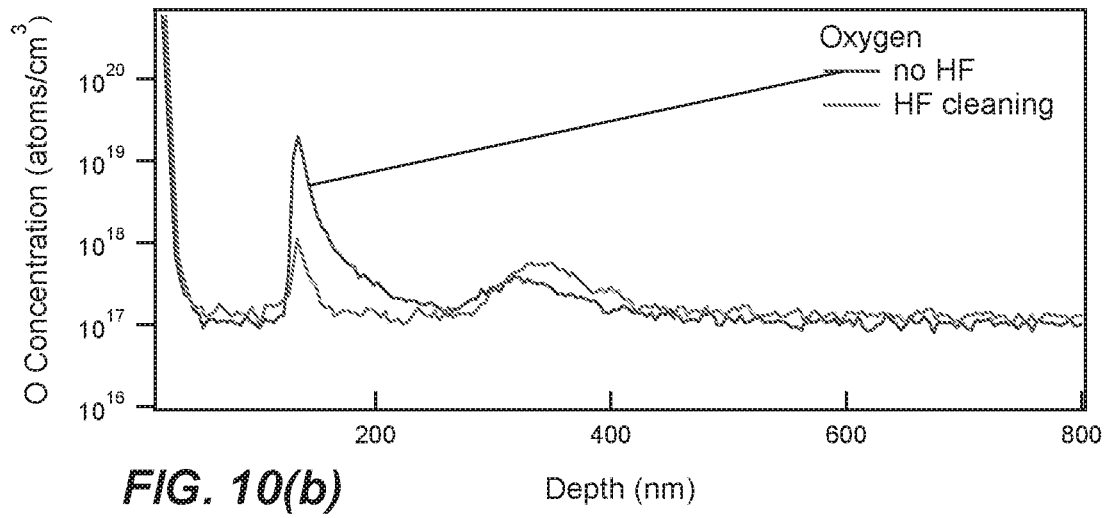
Figure 10C:
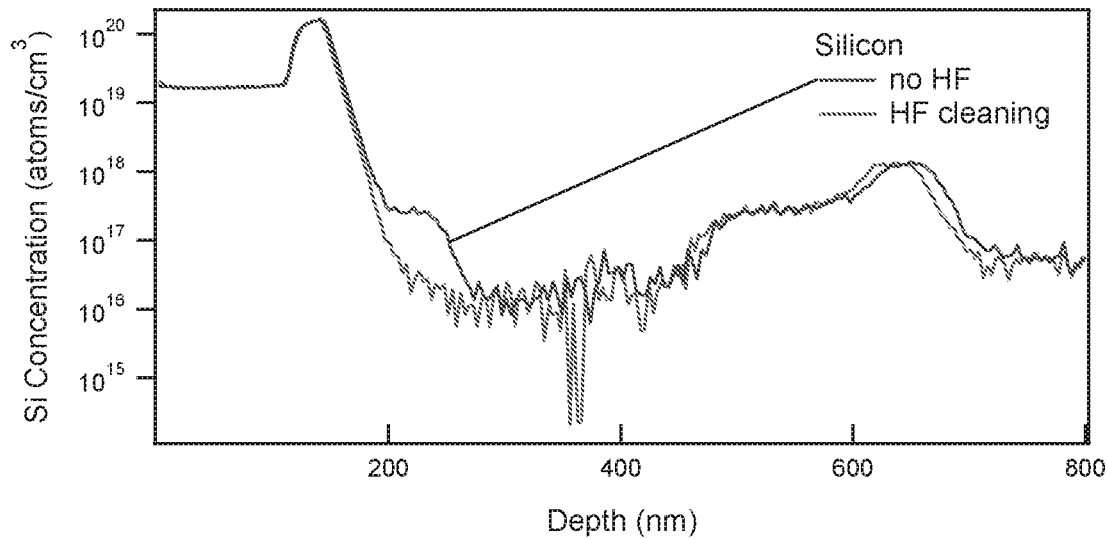

FIG. 9 shows the following regrowth interface concentrations:

no cleaning sample: [Mg]=3e19/cm³, [O]=2e19/cm³;
HF sample: [Mg] 1.3e19/cm³, [O]=1.2e18/cm³.

Thus, FIG. 9 shows the HF treatment produces an order of magnitude reduction in interface [O] concentration and a 50% reduction in Mg.

Process Steps

Figure 11:
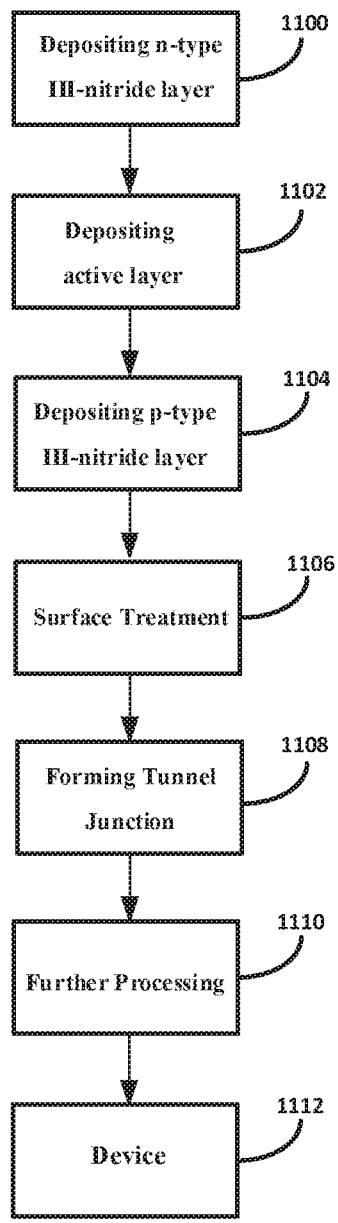
FIG. 11 is a flowchart illustrating a method of fabricating an optoelectronic device.

FIG. 11 is a flowchart illustrating a method of fabricating an optoelectronic or electronic device.

The method can comprise the following steps.

Block 1100 represents depositing a first n-type III-nitride layer 610, 1202 (e.g., n-GaN) on or above a substrate 1204. The substrate 1204 can comprise a foreign substrate supporting heteroepitaxial growth of III-nitride, including, but not limited to sapphire or spinel, or a homoepitaxial III-nitride substrate, including, but not limited to GaN, AlN, or InGaN. The first n-type III-nitride layer can be deposited on a patterned surface of the foreign or homoepitaxial substrate. C-plane polar, semipolar, or nonpolar III-nitride substrates can be used to form polar, semipolar or nonpolar III-nitride device layers on the substrates.

Block 1102 represents depositing a I-nitride active layer 608, 1206 (e.g., InGaN quantum wells) on or above the n-type III-nitride layer 1202, 610.

Block 1104 represents depositing one or more p-type III-nitride layer(s) 612, 618, 1208 (e.g., p-GaN) on or above the III-nitride active layer 608, 1206. Layers deposited in blocks 1100-1104 can be deposited by MOCVD, for example.

Thus, Blocks 1100-1102 illustrate an example of fabricating or obtaining a p-n junction structure 1210 comprising a p-type layer or material 612, 618, 1208 on or above an n-type layer or material 610, 1202.

Block 1106 represents treating a surface 620, 1212 of the p-type layer 618, 1208 (e.g., p-GaN) of the p-n junction 1210 structure. For example, the treating comprises exposing the surface 620, 1212 to at least one compound selected from a Hydrogen Fluoride (HF) solution, gaseous HF, a Hydrogen Chloride (HCL) solution, gaseous HCL, a mixture of Nitric acid and HCl, and Xenon difluoride ($XeF_2$). The treating can comprise etching (e.g., dry or wet etching) the surface 620, 1212.

Block 1108 represents depositing n-type material (e.g., one or more second n-type III-nitride layers 602, 604, 606, 1214a, 1214b, 1214c or a structure on the p-type III-nitride layer 618), forming a tunnel junction 616, 1216 between the second n-type 11-nitride layer 1214, 602 and the p-type III-nitride layer 618, 1208. The second n-type III-nitride structure 1214 can comprise a thicker n-type (Si) doped GaN layer 1214b, 604 between two thinner 1214a, 602, 1214c, 606 and more highly n-type (Si) doped GaN layers (first and second n+ GaN layers 1214a, 1214b). The first n+-GaN/III-nitride layer 602, 1214a closest to the p-type III-nitride layer 1208, 618 can form the tunnel junction 1216, 616, the thicker n⁻-GaN/III-nitride layer 604, 1214b can provide current spreading, and the second topmost n+-GaN/III-nitride layer 1214c, 606 can provide n-contact to the n-contact metallization 1218. These layers can be deposited by MBE, for example.

Block 1110 represents further processing (including deposition of n-contact metallization 1218 onto the second topmost n+-GaN layer 606, 1214c and deposition of metal pads 1220).

Figure 12A:
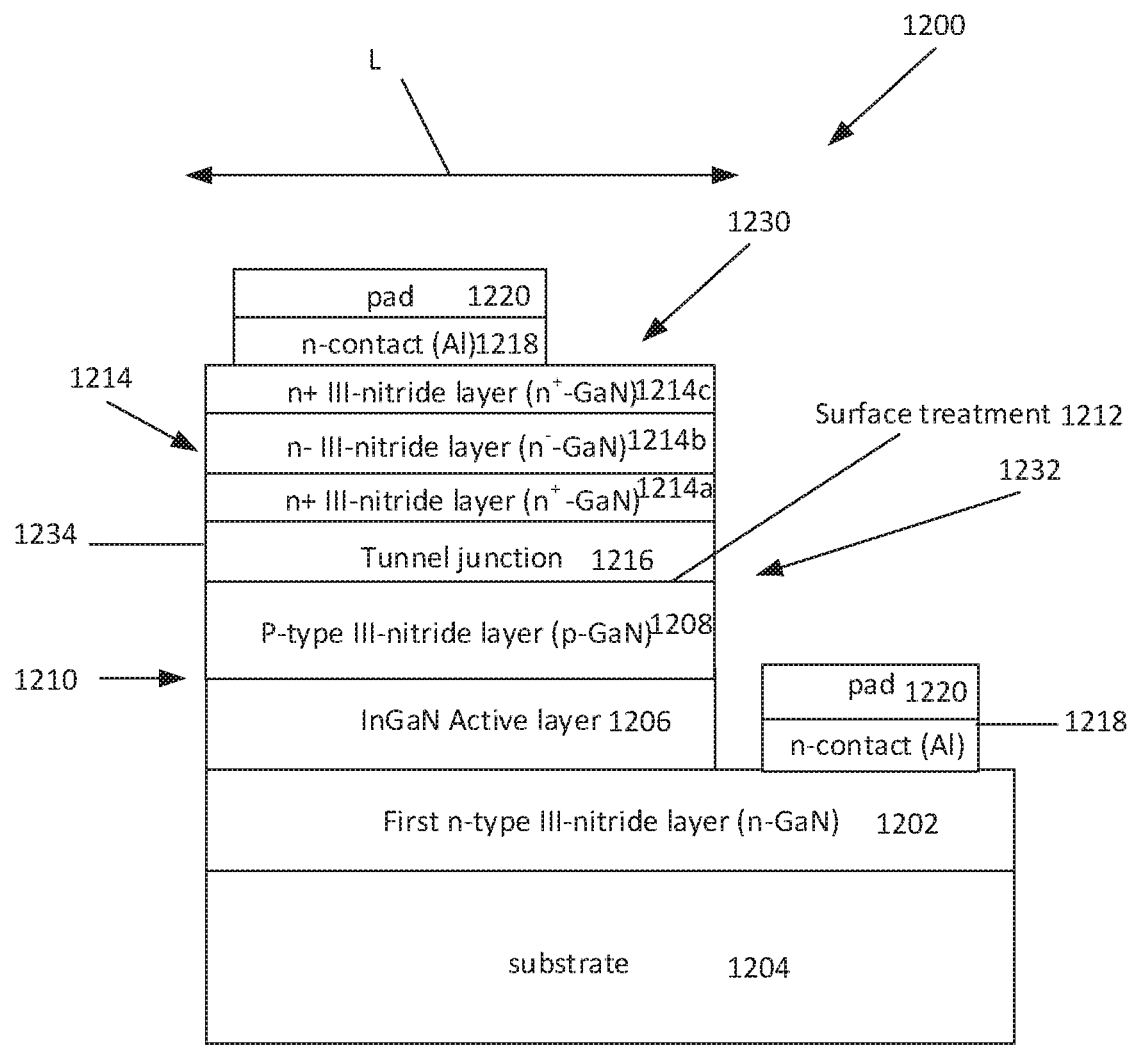
FIG. 12(a) is a cross-sectional schematic of an optoelectronic device.
Figure 12B:
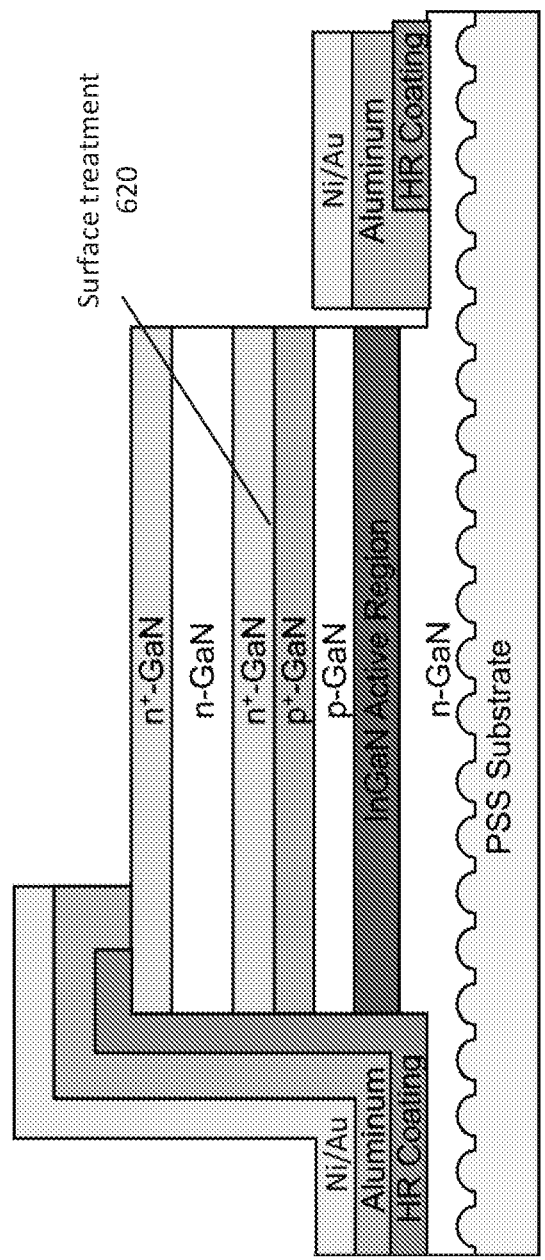
FIG. 12(b) is a cross-sectional schematic of a Lateral Tunnel Junction LED.
Figure 12C:
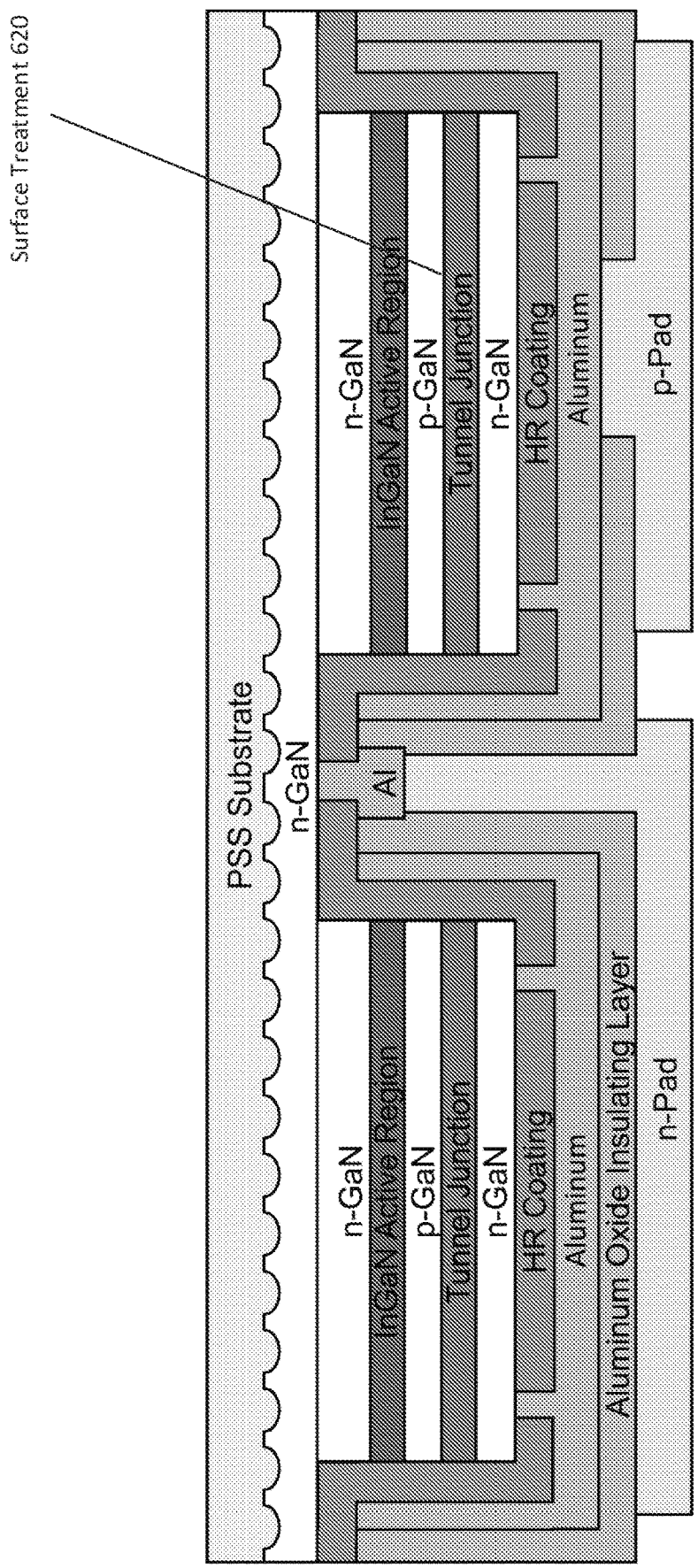
FIG. 12(c) is a cross-sectional schematic of a Flip Chip LED.

Block 1112 represents the end result, a device 1200, e.g., as illustrated in FIG. 12(a). The device 1200 can comprise an optoelectronic or electronic device including a p-n junction structure 1210 comprising a p-type (III-nitride) layer 1208 on or above an n-type (III-nitride) layer 1202; n-type (III-nitride) material 1214a on a surface treated surface 1212 of the p-type layer 1208, forming a tunnel junction 1216 between the p-type layer 1208 and the n-type material 1214c, wherein the treating reduces a concentration of acceptors or impurities at the interface 1222 of the tunnel junction 1210 with the p-type layer 1208 and in the n-type material 1214, 1214c, such that a magnesium concentration at the interface 1222 is reduced by at least 50% (e.g., to no more than 1.3e19/cm$^3$), and/or an oxygen concentration at the interface/surface 1222 is reduced (e.g., to no more than 1.2e18/cm$^3$). Layers 1202, 1204, 1206, 1208, and 1214a-c can be identical to layers 610, 608, 612, 618, 602, 604, and 606 in FIG. 6, for example.

Figure 13:
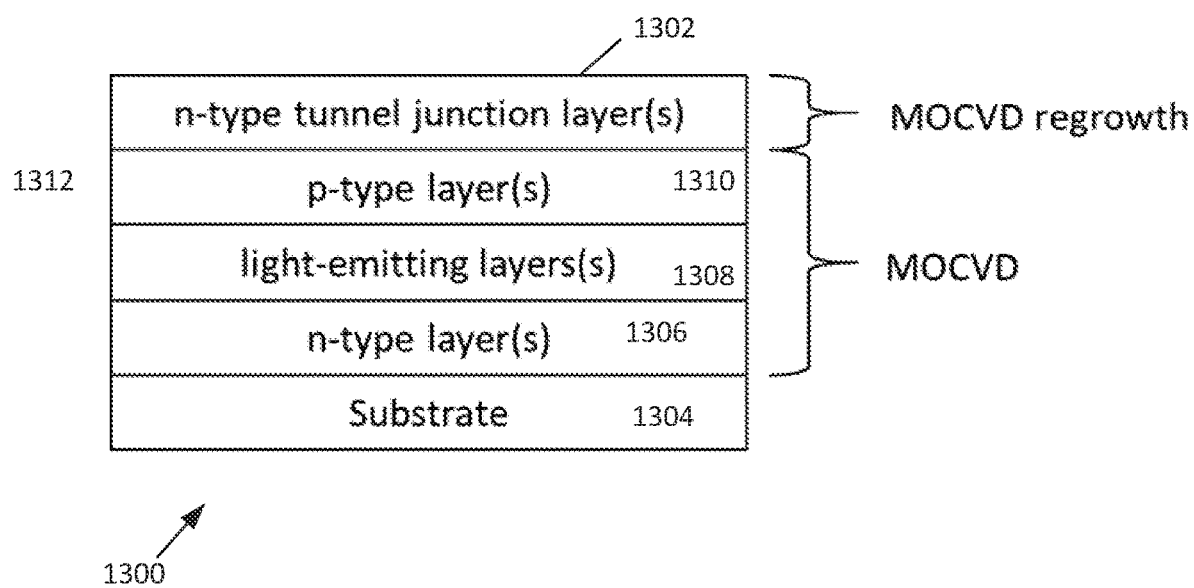
FIG. 13 is a schematic of an epitaxial structure for an MOCVD tunnel junction regrown on an MOCVD LED, according to one embodiment.
Figure 14:
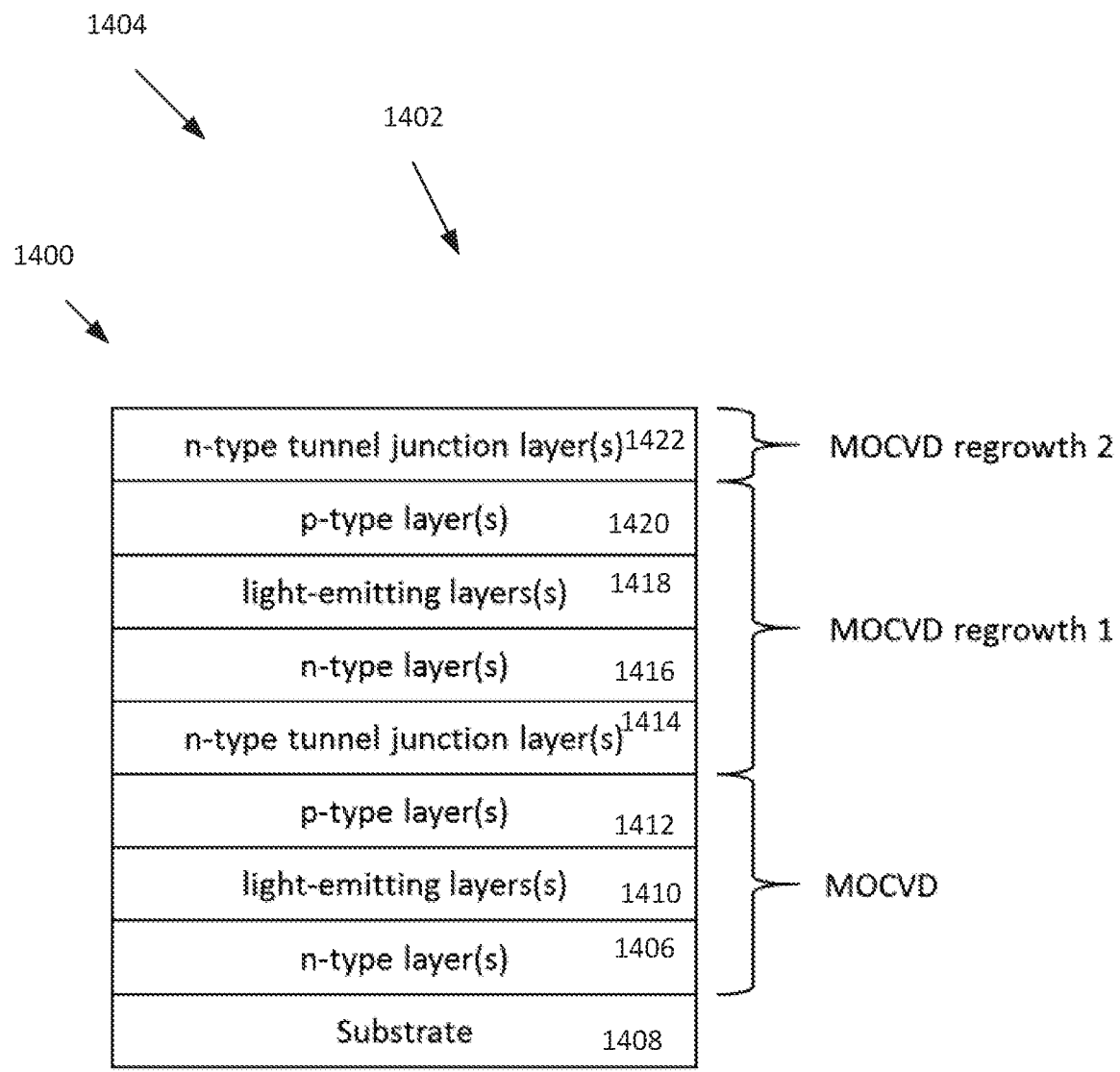
FIG. 14 is a schematic of an epitaxial structure for a double junction MOCVD LED with an MOCVD tunnel junction sandwiched therebetween, according to one embodiment.

An External Quantum Efficiency of 76% has been obtained using a device with a mirror, see [8], as illustrated in FIGS. 13 and 14.

In the case where the device is a laser diode (EELD or VCSEL), additional layers (e.g., waveguiding layers) can be added. One or more embodiments of the present invention could be applied to the device structures in [6] and [7]. Device layers can be modified to fabricate electronic devices such as transistors and solar cells.

Advantages and Improvements

Current commercially-available III-nitride light-emitting diodes (LEDs) use an active region in a biased p-n junction to allow for electron and hole injection. The p-GaN is difficult to contact electrically and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

One or more embodiments of the present invention use a very highly doped (n$^+$/p$^+$) interface that can allow for electrons to tunnel between the valence band and conduction band and is called a tunnel junction (TJ). A low resistance tunnel junction on top of p-GaN allows for current spreading in n-GaN on both sides of the device as well as the use of low resistance n-type contacts on both sides. The use of n-GaN for current spreading allows for the elimination of a TCO or silver mirror in an LED design.

Furthermore, the HF treatment was found to reduce the Mg level at the interface as well as reduce the concentration incorporated in the n-GaN layer above the p-GaN. The oxygen levels were also decreased by a similar amount as the Mg. This reduction of excess Mg at the surface reduces the Mg memory effect and decreases the operating voltage of the tunnel junction.

Accordingly, the present invention could improve the efficiency of III-Nitride LEDs by improving the light extraction out of the chip. This would reduce the energy use of LEDs and allow for more power out of a single chip.

REFERENCES FOR PART B. WHICH REFERENCES ARE INCORPORATED BY REFERENCE HEREIN

[1] L. Esaki, Physical Review 109, (1958)
[2] J. Simon et al. Science 327 (5961): 60-64
[3] S. Krishnamoorthy et al, Appl. Phys. Lett. 105, 141104 (2014).
[4] S. Krishnamoorth et al, Nano Lett. 13, 2570-2575 (2013).
[5] PCT International Utility Patent Application Serial No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES."
[6] E. C. Young, B. P. Yonkee, F. Wu, S. H. Oh, S. P. Den Baars, S. Nakamura, et al., Appl. Phys. Express. 9, 022102 (2016).
[7] John T. Leonard, Steven P. DenBaars, James S. Speck, and Shuji Nakamura, entitled "Demonstration of a III-nitride edge-emitting laser diode utilizing a GaN tunnel junction Contact," vol. 24, No. 7|DOI:10.1364/OE.24.007816|OPTICS EXPRESS 7816.
[8] Yonkee et. al., "Silver free III-nitride flip chip light emitting diode with wall plug efficiency over 70% utilizing a GaN tunnel junction," Applied Physics Letters, Volume 109, Issue 19, id.191104.

C. MOCVD Regrowth Deposition Method for III-Nitride Tunnel Junction Devices

Several techniques have been used for improving the performance of III-nitride electronic and optoelectronic devices. The term "III-nitrides" refers to any alloy composition of the (Al,Ga,In,B)N semiconductors having the formula $Al_wGa_xIn_yB_zN$, where $0 \le w \le 1$, $0 \le x \le 1$, $0 \le y \le 1$, $0 \le z \le 1$, and $w+x+y+z=1$. Commercially available III-nitride devices typically are epitaxially grown in the c-direction [0001] on sapphire substrates. However, efforts have therefore been made to grow on bulk III-nitride substrates in different orientations, including the basal c-plane {0001}; nonpolar a-plane {1 1 −2 0} and m-plane {1 0 −1 0} families; and semipolar plane families that have at least two nonzero h, i, or k Miller indices and a nonzero 1 Miller index, such as the {2 0 −2 1} planes.

Current commercially-available III-nitride light-emitting diodes (LEDs) and edge-emitting laser diodes (EELDs) use an active region in a biased p-n junction to allow for electron and hole injection. However, p-type gallium nitride (p-GaN) is difficult to contact electrically, and has low hole concentration and mobility. This means that p-GaN cannot be used as a current spreading layer and that traditional p-contacts will add significant voltage to devices. Despite these inherent problems, all commercial light emitting devices utilize traditional p-contacts and materials other than p-GaN for current spreading, which typically comprise transparent conducting oxides (TCO), such as indium tin oxide (ITO).

A low resistance tunnel junction on top of p-GaN would allow for current spreading in n-type GaN (n-GaN) on both sides of the device, as well as the use of low resistance n-type contacts on both sides of the device. A tunnel junction is a diode comprised of a very highly doped (n+/p+) interface that allows for electrons to tunnel between the valence band and conduction band. This was first demonstrated by Esaki [1] in highly-doped Ge homojunctions with very thin depletion regions.

In principle, a highly-doped Esaki-type homojunction diode should provide the lowest-loss tunnel junction. However, there have been a number of difficulties in achieving high quality tunnel junctions in the GaN material system.

For example, GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles

[4]. However, these approaches are all associated with losses, either in terms of voltage or resistance increases, or optical losses in the final device performance.

In another example, magnesium (Mg) doped p-GaN grown by MOCVD is compensated by hydrogen (H) as grown, and it must be annealed after growth to remove the hydrogen. This anneal can only work if the p-GaN is not covered by n-GaN, as hydrogen cannot easily diffuse through n-GaN. This limits the effectiveness of tunnel junctions and prevents their widespread use.

Thus, there is a need in the art for structure for improving the performance of III-nitride devices. The present invention satisfies this need.

MOCVD LEDs with MOCVD Tunnel Junctions

This section describes a method for fabricating III-nitride tunnel junction devices that uses MOCVD growth to grow one or more III-nitride light-emitting or light-absorbing structures and MOCVD regrowth to grow one or more III-nitride tunnel junction layers on or above the III-nitride light-emitting or light-absorbing structures. This is illustrated by FIG. 13, which is a schematic of an epitaxial structure 1300 for n-type III-nitride tunnel junction layer(s) 1302 regrown by MOCVD on or above an LED comprised of a substrate 1304, n-type III-nitride layer(s) 1306, III-nitride light-emitting layer(s) 1308, and p-type III-nitride layer(s) 1310 grown by MOCVD, wherein the layers 1302, 1306, 1308, and 1310 of the epitaxial structure 1300 are annotated by MOCVD growth and MOCVD regrowth to the right of the layers 1302, 1306, 1308, and 1310.

Tunnel junctions grown by MOCVD are difficult to achieve, because the as-grown Mg-doped layers are insulating due to hydrogen passivation, and are typically activated by a post-growth anneal. If a tunnel junction is grown by MOCVD, the p-GaN therein cannot be activated, because hydrogen will not diffuse through the top n-GaN layer of the tunnel junction if it is too thick.

It is also difficult to produce well-defined junctions, because of a phenomena known as the Mg memory effect [5]. The Mg memory effect causes the surface of p-GaN to have a high concentration of Mg, which has been shown to diffuse into subsequent MOCVD regrowth layers [6] due in part to the high temperatures required to grow GaN using MOCVD.

MOCVD, also referred to as organo-metallic vapor phase epitaxy (OMVPE), is a type of chemical vapor deposition (CVD) method used to form thin films of various materials and microstructures. This is achieved by flowing volatile organo-metallic gaseous precursors containing group II or II elements along with gaseous precursors containing group V or VI elements over a homoepitaxial or heteroepitaxial substrate at elevated temperatures in order decompose said precursors leading to the growth of high quality single crystal films of various compound semiconductors [7].

P-type GaN is a highly resistive material formed by doping GaN films with Mg. Since MOCVD reactions take place at elevated temperatures in the presence of hydrogen gas, charge carrying holes become compensated by the presence of hydrogen-magnesium (H—Mg) complexes. In order to activate the holes, these complexes must be dissociated through a high temperature anneal [8]. In addition, carrier concentrations are only a few percent relative to dopant concentrations due to the high activation energy of Mg relative to the valence band edge of III-nitrides. The relatively low hole concentrations make forming low resistance ohmic contacts to p-GaN challenging. N-type transparent conductive oxides are typically used to make contact to p-GaN. They form a tunnel junction contact to p-GaN and inject holes from the conduction band of the n-type material into the valence band of p-GaN. Homojunctions can also be used to tunnel carriers into p-GaN. This has been successfully demonstrated through the use of MBE regrowth of highly doped n-GaN onto p-GaN [9]-[11].

MOCVD regrowth of n-type GaN is more of a challenge since the p-GaN surface can become re-passivated by the presence of hydrogen at elevated temperatures. Although some examples of in situ MOCVD grown tunnel junctions exist for LEDs [12], [13], their turn-on voltage and series resistance are higher than those of their reference devices. This is likely due to issues with controlling the p+/n+ junction interface and issues activating the Mg in the p-GaN layer. During growth of p-GaN, the presence of Mg in the chamber after the flow of the Mg precursor has stopped creates a "memory effect" in the subsequent films, whereby Mg is present at relatively high concentration in layers that should be Si doped n-type. Two solutions to this are to stop growth, dip the films in an acid ex situ to remove surface Mg and regrow the n-GaN [6], or utilize a low temperature flow modulated in situ during growth [14].

Once MOCVD deposition is used to grow the n-GaN layer on top of the p-GaN, the p-GaN can be re-activated while being buried beneath the n-GaN using exposed mesa sidewalls [15]. Effective re-activation of the p-GaN films can occur if the lateral dimensions of the device are on the order of the diffusion length of hydrogen when it is released from the H—Mg complex during the reactivation anneal. Small lateral dimensions found in narrow ridge width EELDs, small diameter VCSELs, and micro LEDs would be ideal structures for this method. This method could also allow for the regrowth of additional LED epitaxial layers by MOCVD on top of the first LED, because the hydrogen cannot diffuse through the top n-GaN layer.

Figure 15:
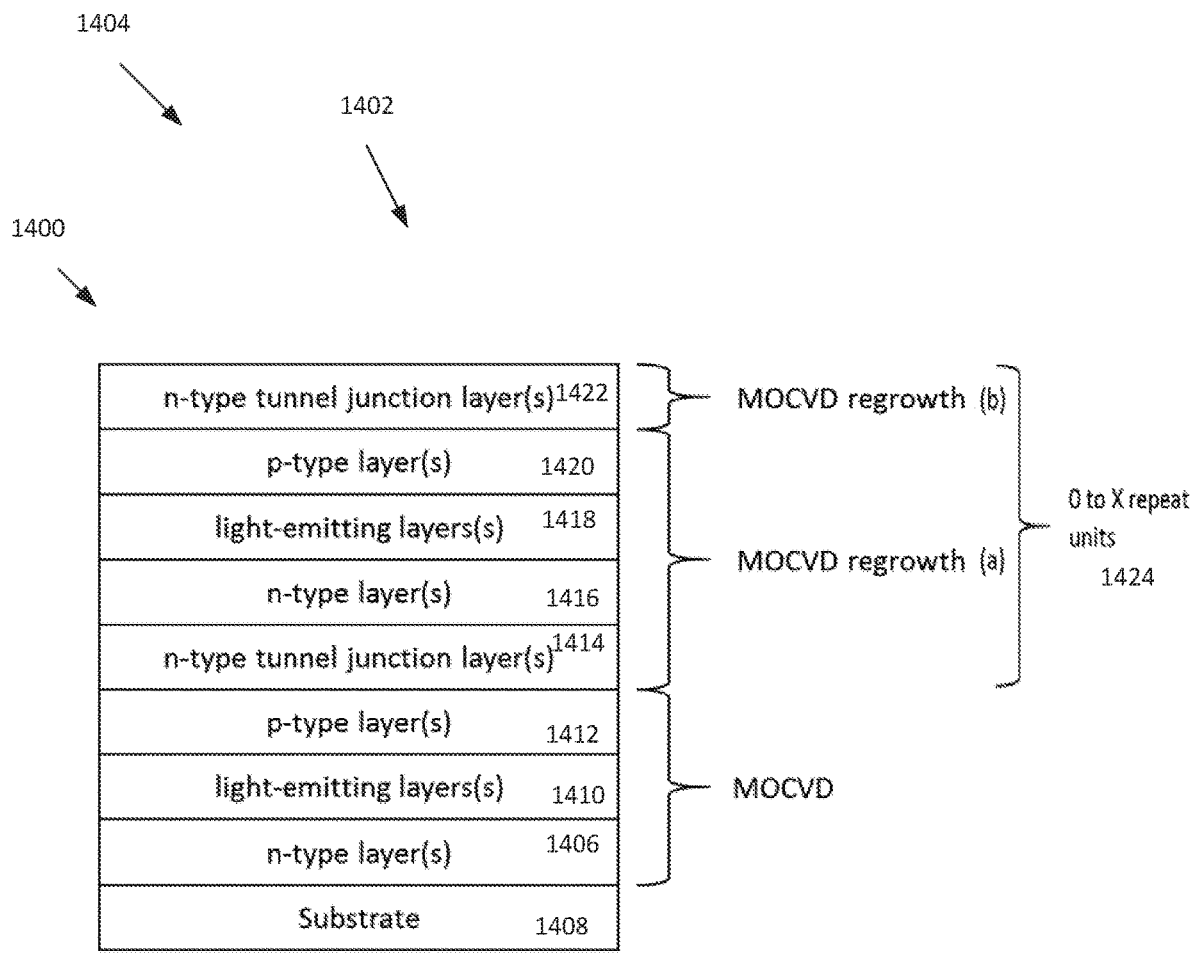
FIG. 15 is a schematic of an epitaxial structure for a multi-junction MOCVD LED with an MOCVD deposited tunnel junction sandwiched therebetween, according to one embodiment.

FIGS. 14 and 15 illustrate variants of the structure shown in FIG. 13. FIG. 14 is a schematic of an epitaxial structure 1400 for a double junction MOCVD III-nitride LED with an MOCVD III-nitride tunnel junction 1414 sandwiched therebetween, wherein the layers of the structure are annotated by MOCVD, MOCVD regrowth 1, and MOCVD regrowth 2, to the right of the layers. The epitaxial structure 1400 comprises a second epitaxial structure 1402 on a first epitaxial structure 1404. The first epitaxial structure 1404 comprises one or more first n-type layers 1406 on a substrate 1408, one or more first light emitting layers 1410 on the one or first more n-type layers 1406, one or more first p-type layers 1412 on the one or more first light emitting layers 1410, and one or more first n-type tunnel junction layers 1414 on the one or more p-type layers 1412. The second epitaxial structure 1402 comprises one or more second n-type layers 1416 on layer(s) 1414, one or more second light emitting layers 1418 on the one or second more n-type layers 1416, one or more second p-type layers 1420 on the one or more second light emitting layers 1418, and one or more second n-type tunnel junction layers 1422 on the one or more p-type layers 1420.

FIG. 3 is a schematic of an epitaxial structure for a multi-junction MOCVD III-nitride LED with two MOCVD III-nitride tunnel junctions, wherein the layers of the structure are annotated by MOCVD, MOCVD regrowth (a), and MOCVD regrowth (b), and a repeat sequence for 0 to X repeat units, to the right of the layers, so as to form 0 . . . X repeat units 1424 of the epitaxial structure 1402, where X is an integer.

VCSEL Structures

In addition to the III-nitride tunnel junction LEDs described above, the present invention can also be applied to VCSELs, which have a long history of prior art dating back to the 1970's [16]. III-nitride VCSELs represent a new class of VCSELs that represent a new set of unique challenges and device designs compared to conventional III-arsenide VCSELs [17]. The present invention provides a regrowth technique for achieving high-quality III-nitride tunnel junction intracavity contacts in III-nitride VCSELs.

Figure 16:
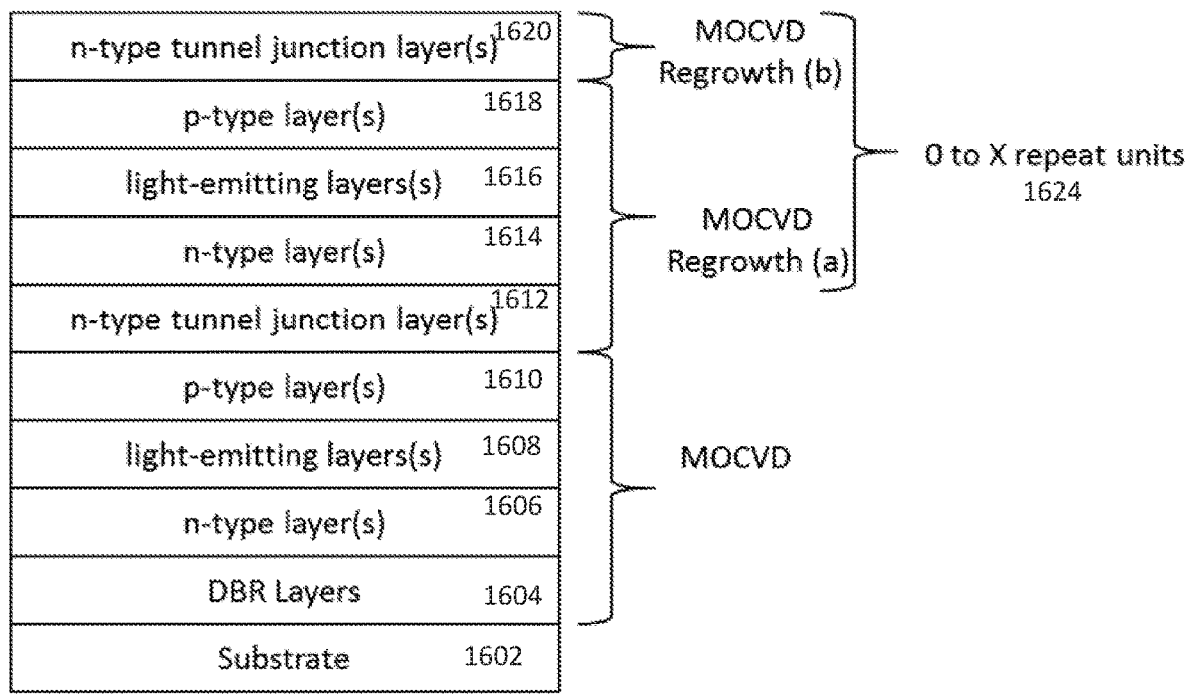
FIG. 16 is a schematic of an epitaxial structure for a VCSEL employing sputter-deposited tunnel junction intracavity contacts, according to one embodiment.

FIG. 16 is a schematic that shows possible epitaxial structures, growth methods and repeat sequences, wherein one or more regrown MOCVD tunnel junctions are used in a III-nitride VCSEL structure, wherein the layers of the structure are annotated by the MOCVD growth technique, MOCVD regrowth technique (a), and MOCVD regrowth technique (b), and repeat sequence for 0 to X repeat units, to the right of the layers.

The VCSEL structure may employ electron cyclotron resonance (ECR) sputter-deposited tunnel junction intracavity contacts.

In this design, the VCSEL structure 1600 includes a substrate 1602, followed by distributed Bragg reflector (DBR) dielectric layers 1604, n-type III-nitride layers(s) 1606, light-emitting III-nitride layer(s) 1608, 1616, and p-type III-nitride layer(s) 1610 grown by MOCVD, which are followed by n-type III-nitride tunnel junction layer(s) 1612 regrown by MOCVD, which are followed by n-type III-nitride layers(s) 1614, III-nitride light-emitting layer(s) 1616, and p-type III-nitride layer(s) 1618 regrown by MOCVD, which are followed by n-type III-nitride tunnel junction layer(s) 1620 regrown by MOCVD. The MOCVD regrowth (a) and (b) may be repeated so as to form 0 . . . X repeat units 1622 of the epitaxial structure 1624, where X is an integer.

The order of the epitaxial layers shown in FIG. 16 makes the structure 1600 appropriate for fabricating a flip-chip VCSEL using laser lift-off of the substrate 1602 and DBR dielectric layers 1604. By growing the repeat unit shown, a device can be made with a cascade of active regions 1608, 1616 aligned to peaks of the cavity mode in the finished device.

The order of the epitaxial layers shown in these designs makes these structures appropriate for fabricating VCSELs employing epitaxially grown DBRs on the n-side as shown, or epitaxial DBRs on both the p-side and n-side (dual epitaxial DBRs), or an epitaxial DBR on the n-side and a dielectric DBR on the p-side (hybrid DBRs). Only the layers that comprise the epitaxial growth process are shown (i.e., no dielectric or metal layers are shown).

All of the designs show that one could make a cascade of active regions by increasing the identified repeat unit. Designs can be made such that it is composed of an epitaxial structure for a VCSEL employing a hybrid DBR design or a dual epitaxial DBR VCSEL with a light-absorbing layer that may act to monitor the emitted power from the light-emitting region(s), wherein the structure does or does not include a tunnel-junction cap, or the light-absorbing layer is grown before the light-emitting layers.

Process Steps

Figure 17:
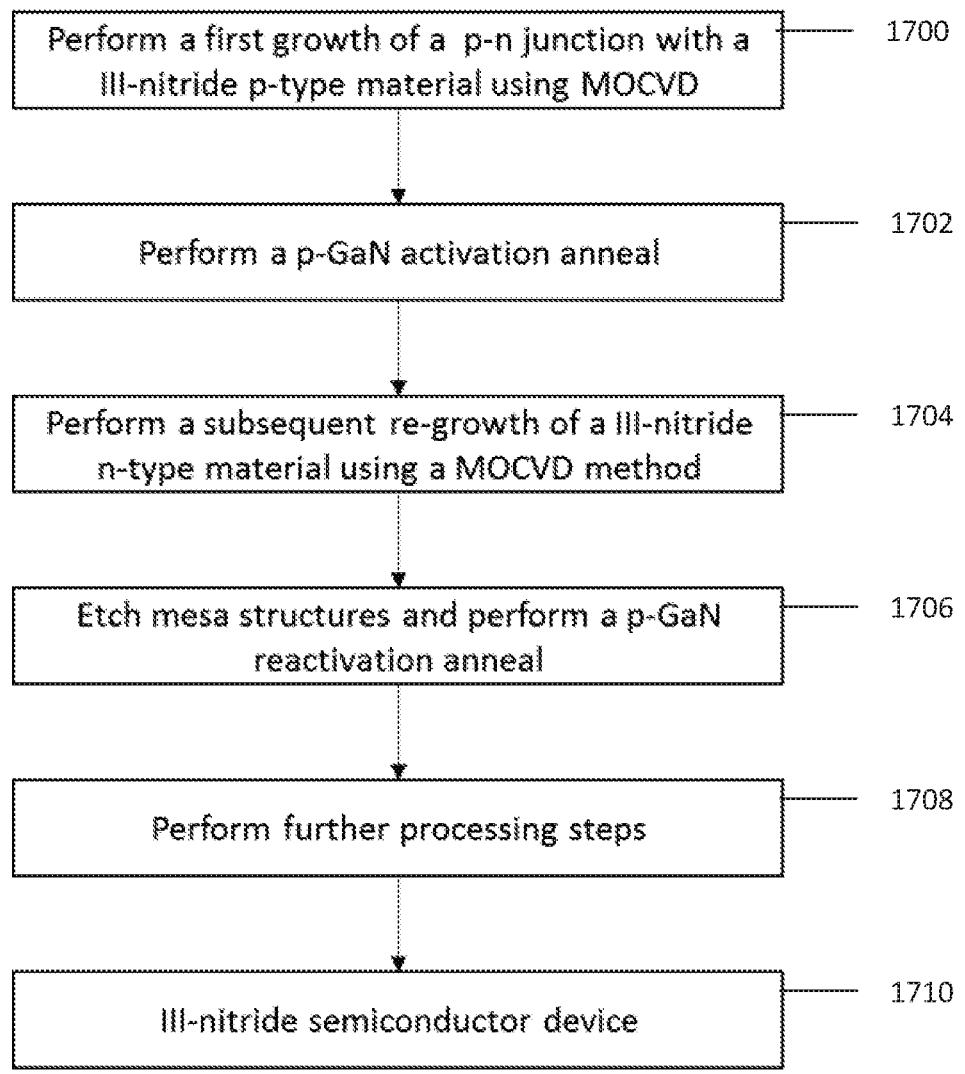
FIG. 17 is a process flow diagram for forming an n-GaN tunnel junction to p-GaN on a III-nitride semiconductor device.

FIG. 17 is a process diagram illustrating the steps for forming an n-GaN tunnel junction to p-GaN on a III-nitride semiconductor device 1200, e.g., as illustrated in FIG. 12(a), according to one or more embodiments.

Block 1700 represents performing a first growth of a first active region 1206 in a p-n junction 1210 using MOCVD, the p-n junction 1210 comprising a p-type layer 1208 and an n-type layer 1202.

Block 1702 represents optionally performing a p-GaN activation anneal.

Block 1704 represents performing a subsequent regrowth of a III-nitride material (e.g., n-type material 1214a, 1214b, 1214c) using MOCVD or another growth technique.

Block 1706 represents etching mesa structures 1230 and performing a reactivation of the p-type material 1208, e.g., by annealing. Reactivating the p-type layer 1208 may comprise lateral diffusion of hydrogen through mesa sidewalls 1232 in the III-nitride material, the mesa 1230 having one or more lateral dimensions L that are less than or equal to about 200 µm.

Block 1708 represents performing further processing/growth steps, e.g., growth of additional active regions 1616. In one or more embodiments, the step comprises performing another growth of III-nitride material using metal organic chemical vapor deposition (MOCVD), after the subsequent regrowth, comprising a second active region 1616 on or above the tunnel junction 1620 and with or without another set of n-type III-nitride and/or p-type III-nitride layers.

Block 1710 represents the end result, a III-nitride semiconductor device 1200.

In one or more embodiments, the subsequent regrowth forms a tunnel junction 1216.

In one or more embodiments, the p-n junction comprises the n-type layer 1202, the p-type layer 1208, and the first active region 1206 between the p-type layer 1208 and the n-type layer 1202, the n-type layer 1202 and the first active region 1206 are grown using MOCVD, and the p-type layer 1208 and the tunnel junction 1216 are grown using chemical vapor deposition (CVD).

In one or more embodiments, the III-nitride material in the subsequent regrowth comprises doped p-type material 618 having a higher p-type dopant concentration than the p-type layer 612 so as to reduce contact resistance of the tunnel junction 616.

In one or more embodiments, the III-nitride material in the subsequent regrowth ends with second n-type layer 1214c having a thickness between about 1 nm to about 5000 nm.

In one or more embodiments, the III-nitride material in the subsequent regrowth includes a second n-type layer 602 and a second p-type layer 618, and the tunnel junction 616, 1216 is formed at a regrowth interface 1234 between the second n-type layer 1214a and the second p-type layer 618.

In one or more embodiments, delta-doping is used at the regrowth interface 1234.

In one or more embodiments, the first active region 1410 is a first light-emitting diode (LED) emitting a first wavelength of light, and the second active region 1418 is a second LED emitting a second wavelength similar to the first wavelength, such that efficiency droop in the LED reduced through use of the multiple active regions 1410, 1418.

In one or more embodiments, the first active region 1410 is a first light-emitting diode (LED) emitting a first wavelength of light and the second active region 1418 is a second LED emitting a wavelength different from the first wavelength, such that the device emits light having a range of wavelengths.

In one or more embodiments, the first and second active regions 1608, 1616 emit electromagnetic radiation having similar wavelengths and are aligned to peaks of a cavity mode in a vertical-cavity surface-emitting laser (VCSEL).

In one or more embodiments, the first active region 1410, 1608 is in a light-emitting diode (LED), a vertical cavity surface emitting laser (VCSEL), or an edge-emitting laser diode (EELD), the second active region 1616, 1418 comprises a single or multiple quantum well structure emitting a first wavelength of electromagnetic radiation in response to optical pumping by emission from the first active region 1410, 1608, and the emission from the first active region 1410, 1608 having a shorter wavelength than the first wavelength.

In one or more embodiments, the second active region 1616, 1418 is in a light-emitting diode (LED), a vertical cavity surface emitting laser (VCSEL), or an edge-emitting laser diode (EELD), the first active region 1410, 1608 comprises a single or multiple quantum well structure emitting a first wavelength of electromagnetic radiation in response to optical pumping by emission from the second active region 1616, 1418, and the emission from the second active region 1616, 1418 having a shorter wavelength than the first wavelength.

In one or more embodiments, the method comprises using a photodiode comprising the quantum well structure 1616, 1418, 1410, 1608 to monitor the emissions of shorter wavelength from the first or second active region 1616, 1418, 1410, 1608.

In one or more embodiments, the first active region 1410 is in a light-emitting diode (LED) emitting a first wavelength of electromagnetic radiation, and the second active region 1418 is in an LED emitting a wavelength different form the first wavelength.

In one or more embodiments, the device is a light-emitting diode (LED), a vertical cavity surface emitting laser (VCSEL), or an edge-emitting laser diode (EELD), and the subsequent regrowth comprises a top n-GaN layer 1422 serving as a current spreading layer.

In one or more embodiments, the method comprises repeating steps of Blocks 1700 and 1704 so as to form multiple p-n junctions separated by multiple embedded tunnel junctions 1414 screening or enhancing polarization fields in the active regions 1418, 1608, 1416, 1616 wherein the device is a light-emitting diode (LED), a vertical cavity surface emitting laser (VCSEL), or an edge-emitting laser diode (EELD).

In one or more embodiments, the device is a light-emitting diode (LED), a vertical cavity surface emitting laser (VCSEL), or an edge-emitting laser diode (EELD), and the p-type layer 1610, 1412 is thinner than in a p-n junction not connected to the tunnel junction 1414, thereby reducing electrical and optical losses in the p-type layer 1412.

In one or more embodiments, the device is a light-emitting diode (LED), and sheet resistance on both sides of the p-n junction is matched to reduce current crowding.

In one or more embodiments, the subsequent regrowth comprises an n-type GaN layer 1422, 1214c the n-type layer comprises an n-type GaN layer, the device is a light-emitting diode (LED), and the n-GaN layers 1422, 1214c are roughened to increase an extraction efficiency of the LED.

In one or more embodiments, the device is a vertical cavity surface emitting laser (VCSEL) processed in a flip-chip geometry with one or more high reflectivity optical coatings to enhance light extraction or confine an optical mode in the VCSEL.

In one or more embodiments, the device is a multi-junction solar cell or photodiode.

In one or more embodiments, the subsequent regrowth comprises a second n-type layer 1214a-c, 1416,1614 and a single metal contact 1218 deposition is used to fabricate contacts to both n-type layers of the device.

In one or more embodiments, the subsequent regrowth comprises a top n-GaN layer 1620, 1422, 1214c and the device does not include a p-contact.

In one or more embodiments, the method comprises repeating steps of Block 1700 and 1704 so as to form multiple p-n junctions and tunnel junctions 1612, 1620, 1414, 1214a-c, the tunnel junctions 1612, 1620, 1414, 1214a-c, comprising an n-type GaN layer, wherein each buried n-GaN layer in the device contacted, such that current flowing through each active region 1410, 1418 is controlled individually.

In one or more embodiments, Magnesium (Mg) concentrations in the subsequent regrowth layers 1414-1422, 1310-1302, 1612-1620 are suppressed, e.g., through exposure to an acid e.g., but not limited to, hydrofluoric acid, hydrochloric acid.

In one or more embodiments, Mg concentrations in the subsequent regrowth layers 1414-1422, 1310-1302, 1612-1620 are suppressed through flow modulation epitaxy, e.g., low temperature flow modulation epitaxy.

In one or more embodiments, Mg is activated through the lateral diffusion of the hydrogen through the mesa sidewalls 1232 at elevated temperatures.

In one or more embodiments, n-type tunnel junction layers 1612, 1620, 1414, 1422 can comprise layers such as 1214a-c.

The subsequent regrowth can use a n-type r-nitride target, a gallium (Ga) target, a gallium-silicon (Ga—Si) alloy target, a gallium-germanium (Ga—Ge) alloy target, group nm element metalorganic vapor precursors, vapor phase Si precursors, vapor phase Ge precursors, and/or a method different from MBE.

EXPERIMENTAL RESULTS

Figure 18:
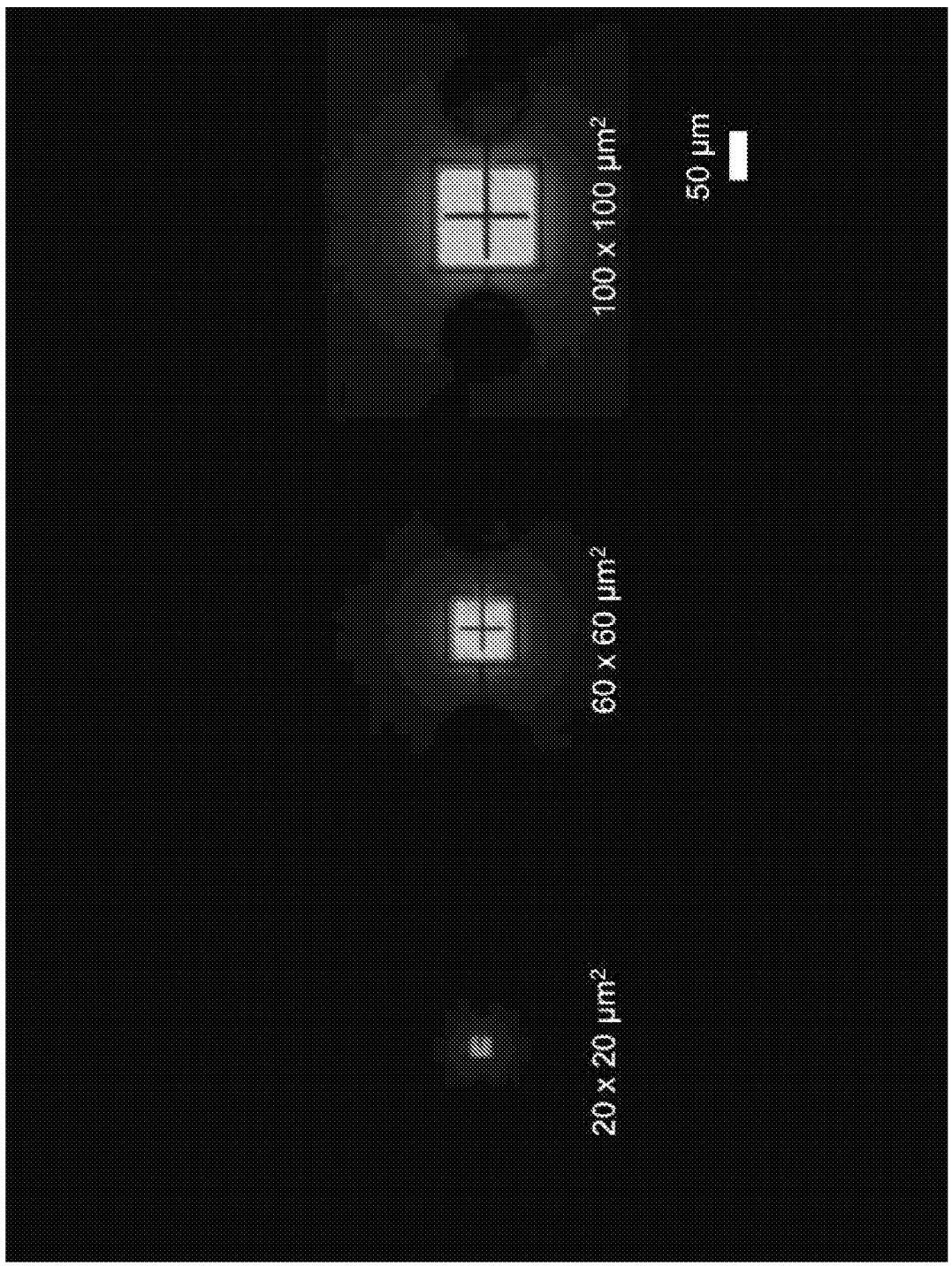
FIG. 18 contains images of blue micro LEDs with dimensions of 20×20 µm$^2$, 60×60 µm$^2$, and 100×100 µm$^2$, under electrical current injection, resulting from an anneal at 700° C. for 30 minutes.

FIG. 18 illustrates the current spreading ability of the MOCVD deposited III-nitride tunnel junction grown on an MOCVD III-nitride LED. The III-nitride micro LEDs in FIG. 18 have dimensions of 20×20 m², 60×60 μm², and 100×100 μm², and have been through a reactivation anneal at 700° C. for 30 minutes. The III-nitride micro LEDs in FIG. 18 have uniform light emission patterns.

Figure 19:
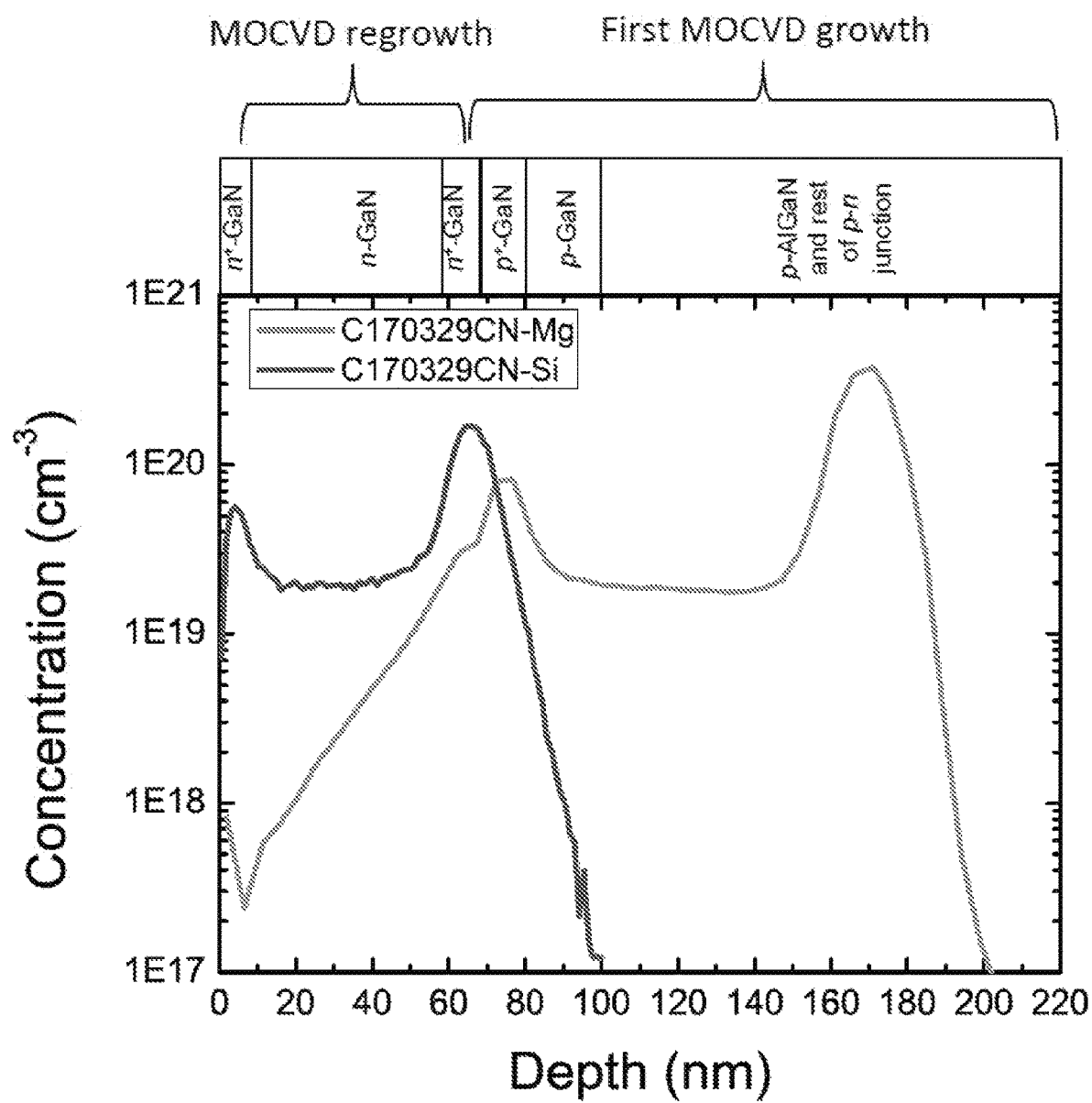
FIG. 19 is a profile of the doping concentrations of Mg and Si taken by secondary ion mass spectroscopy (SIMS) of an MOCVD tunnel junction grown on a p-n junction.

FIG. 19 is a graph of concentration (cm$^{-3}$) vs. depth (nm) illustrating the profiles of the doping concentrations of Mg and Si taken by secondary ion mass spectroscopy (SIMS) of an MOCVD deposited III-nitride tunnel junction grown on a p-n junction grown by MOCVD, with the layers of the structure depicted across the top of the graph in accordance with their depth and annotated by first MOCVD growth and MOCVD regrowth.

REFERENCES PART C, WHICH REFERENCES ARE INCORPORATED BY REFERENCE HEREIN

[1] L. Esaki, "New Phenomenon in Narrow Germanium p-n Junctions," Phys. Rev., vol. 109, no. 2, pp. 603-604, January 1958.

[2] J. Simon, V. Protasenko, C. Lian, H. Xing, and D. Jena, "Polarization-induced hole doping in wide-band-gap uniaxial semiconductor heterostructures.," Science, vol. 327, no. 5961, pp. 60-4, January 2010.

[3] S. Krishnamoorthy, F. Akyol, and S. Rajan, "InGaN/GaN tunnel junctions for hole injection in GaN light emitting diodes," Appl. Phys. Lett., vol. 105, no. 14, p. 141104, October 2014.

[4] S. Krishnamoorthy, F. Akyol, P. S. Park, and S. Rajan, "Low resistance GaN/InGaN/GaN tunnel junctions," Appl. Phys. Lett., vol. 102, no. 11, 2013.

[5] Y. Ohba and A. Hatano, "A study on strong memory effects for Mg doping in GaN metalorganic chemical vapor deposition," Elsevier J. Cryst. Growth, vol. 145, pp. 214-218, 1994.

[6] H. Xing, D. S. Green, H. Yu, T. Mates, P. Kozodoy, S. Keller, S. P. DenBaars, and U. K. Mishra, "Memory Effect and Redistribution of Mg into Sequentially Regrown GaN Layer by Metalorganic Chemical Vapor Deposition," Jpn. J. Appl. Phys., vol. 42, no. Part 1, No. 1, pp. 50-53, January 2003.

[7] G. B. Stringfellow, "Overview of the OMVPE Process," in Organometallic Vapor-Phase Epitaxy, 2nd ed., San Diego: Elsevier, 1999, pp. 1-16.

[8] S. Nakamura, N. Iwasa, M. Senoh, and T. Mukai, "Hole Compensation Mechanism of P-Type GaN Films," Jpn. J. Appl. Phys., vol. 31, no. Part 1, No. 5A, pp. 1258-1266, May 1992.

[9] B. P. Yonkee, E. C. Young, C. Lee, J. T. Leonard, S. P. DenBaars, J. S. Speck, and S. Nakamura, "Demonstration of a III-nitride edge-emitting laser diode utilizing a GaN tunnel junction contact," Opt. Express, vol. 24, no. 7, p. 7816, April 2016.

[10] B. P. Yonkee, R M. Farrell, J. T. Leonard, S. P. DenBaars, J. S. Speck, and S. Nakamura, "Demonstration of low resistance ohmic contacts to p-type (20-2-1) GaN," Semicond. Sci. Technol., vol. 30, no. 7, p. 75007, 2015.

[11] E. C. Young, B. P. Yonkee, F. Wu, S. H. Oh, S. P. DenBaars, S. Nakamura, and J. S. Speck, "Hybrid tunnel junction contacts to III-nitride light-emitting diodes," Appl. Phys. Express, vol. 9, no. 2, p. 22102, February 2016.

[12] T. Takeuchi, G. Hasnain, S. Corzine, M. Hueschen, R. P. Schneider, Jr., C. Kocot, M. Blomqvist, Y. Chang, D. Lefforge, M. R Krames, L. W. Cook, S. A. Stockman, R. P. Schneider, C. Kocot, M. Blomqvist, Y. Chang, D. Lefforge, M. R Krames, L. W. Cook, and S. A. Stockman, "GaN-based light emitting diodes with tunnel junctions," Japanese J. Appl. Phys./Part2, vol. 40, no. 8B, pp. L861-L863, 2001.

[13] J. Seong-Ran, S. Young-Ho, J. Ho-Jin, Y. Gye Mo, H. Soon Won, S. J. Son, S. R. Jeon, Y. H. Song, H. J. Jang, G. M. Yang, S. W. Hwang, and S. J. Son, "Lateral current spreading in GaN-based light-emitting diodes utilizing tunnel contact junctions," Appl. Phys. Lett., vol. 78, no. 21, pp. 3265-3267, 2001.

[14] A. Agarwal, M. Tahhan, T. Mates, S. Keller, and U. Mishra, "Suppression of Mg propagation into subsequent layers grown by MOCVD," J. Appl. Phys., vol. 121, no. 2, p. 25106, 2017.

[15] Y. Kuwano, M. Kaga, T. Morita, K. Yamashita, and K. Yagi, "Lateral Hydrogen Diffusion at p-GaN Layers in Nitride-Based Light Emitting Diodes with Tunnel Junctions Lateral Hydrogen Diffusion at p-GaN Layers in Nitride-Based Light Emitting Diodes with Tunnel Junctions," Jpn. J. Appl. Phys., vol. 12, pp. 8-11, 2013.

[16] K. Iga, "Surface-Emitting Laser-Its Birth and Generation of New Optoelectronics Field," IEEE J. Sel. Top. Quantum Electron., vol. 6, no. 6, 2000.

[17] D. F. Feezell, "Status and future of GaN-based vertical-cavity surface-emitting lasers," 2015, p. 93631G.

D. Self-Emissive III-V Micro LED-Based Displays Using Low Resistance Tunnel Junctions Commercially available display technologies include liquid crystal displays (LCDs) and organic light-emitting diode (OLED) based displays. However, the energy efficiency of these displays are limited, even by state of the art technologies.

LCDs are comprised of many components that are inefficient. The lighting mechanism in an LCD is a backlight unit, which is currently predominantly made of gallium nitride (GaN) based LEDs that give off white light. An alternative backlight would be made of a fluorescent lamp, which would be even more inefficient than an LED backlight unit. Beyond this backlighting unit, there are polarizers, liquid crystals, and color filters, all of which block or lose some of the light emitted from the backlight unit. Altogether, the energy efficiency of an LCD can be less than 10%.

OLED based displays function using a different lighting mechanism, but are also limited in terms of energy efficiency. OLED based displays are self-emissive in that sub-pixels of red-green-blue (RGB) OLEDs form pixels, wherein the RGB subpixels are made of different colored OLEDs that either directly emit a red, green, or blue color or are covered with a filter to achieve the necessary color. State of the art OLEDs limit the energy efficiencies of OLED based displays to less than 30%.

Inorganic III-V compound semiconductors can be more energy efficient than their organic counterparts. The term "III-V compound semiconductor" refers to any alloy composition that uses a combination of B, Ga, Al, or In for the group III element and N, P, As, or Sb for the group V element.

However, current attempts to create displays based on inorganic III-V compound semiconductor micro devices have been hindered by various factors. Inorganic-based displays currently cannot be made flexible, do not have a high throughput fabrication method such as roll-by-roll printing used for OLED displays, and are limited in resolution and size. In order to address these issues, the pixels of a display need to be in the scale of tens of micrometers.

The dominant reason that inorganic I-V compound semiconductor based displays are not commercially viable is because no pick-and-place method can handle their small dimensions. Conventional pick-and-place methods utilize vacuum holes that have diameters of hundreds of micrometers. The smallest size of an inorganic III-V compound semiconductor device must be larger than the vacuum hole and must therefore must have dimensions on the scale of hundreds of micrometers.

Moreover, with inorganic r-nitride semiconductors (a subset of inorganic III-V compound semiconductors), it is difficult to make ohmic contact to p-type gallium nitride (p-GaN). That means that the operating voltage of devices is higher than desired. In addition, because of its high electrical resistance, p-GaN cannot be used as a current spreading layer. To solve these issues, commercially available LEDs use other metals and transparent conducting oxides (TCOs) to reduce voltage and for improved current spreading. The main TCO used for p-GaN is indium tin oxide (ITO), which is highly absorbing in the blue regime. This is the one of the largest areas of loss in LEDs and has a great impact on the efficiency of devices.

Replacing ITO with a low resistance tunnel junction grown on p-GaN would improve the performance of LEDs by using n-type GaN (n-GaN). The n-GaN on top of the p-GaN would act as a current spreading layer and would allow for low-resistance n-type metal contacts. Therefore, a low resistance tunnel junction would allow for lower operating voltages and higher efficiencies.

One major difficulty in growing tunnel junctions by metalorganic chemical vapor deposition (MOCVD) is that the MOCVD growth results in a buried layer of unactivated p-GaN. Typically, p-GaN is activated in a furnace above 500° C. for greater than 10 minutes in order to drive out hydrogen, which compensates the magnesium-doped p-GaN. When n-GaN is grown on top of p-GaN in MOCVD, the p-GaN is difficult to activate because hydrogen will not diffuse easily through the n-GaN.

Thus, there is a need in the art for more efficient displays, in order to reduce the power consumption of display related products, especially commercially viable inorganic III-V compound semiconductor based displays, and more especially commercially viable inorganic III-nitride compound semiconductor based displays. The present invention satisfies this need.

The present invention describes methods to fabricate and assemble low resistance display pixels using inorganic III-V compound semiconductor light-emitting micro devices, such as micro-LEDs or VCSELs. A novel aspect of the present invention is to combine a hybrid MOCVD/MBE growth technique to create the devices with tunnel junctions; an undercut method (such as PEC etching or LLO) to separate the devices from the growth substrate; and a thin film layer transfer via a rubber stamp or other elastomer to arrange the devices on another substrate as RGB subpixels. With these methods, RGB subpixels can be arranged side-by-side to form pixels that have lateral dimensions smaller than 60 μm.

First, the method to transfer subpixels of one color will be described. Then, the technique to assemble and arrange RGB subpixels will be discussed, followed by various applications that are made possible with this invention.

Figure 20:
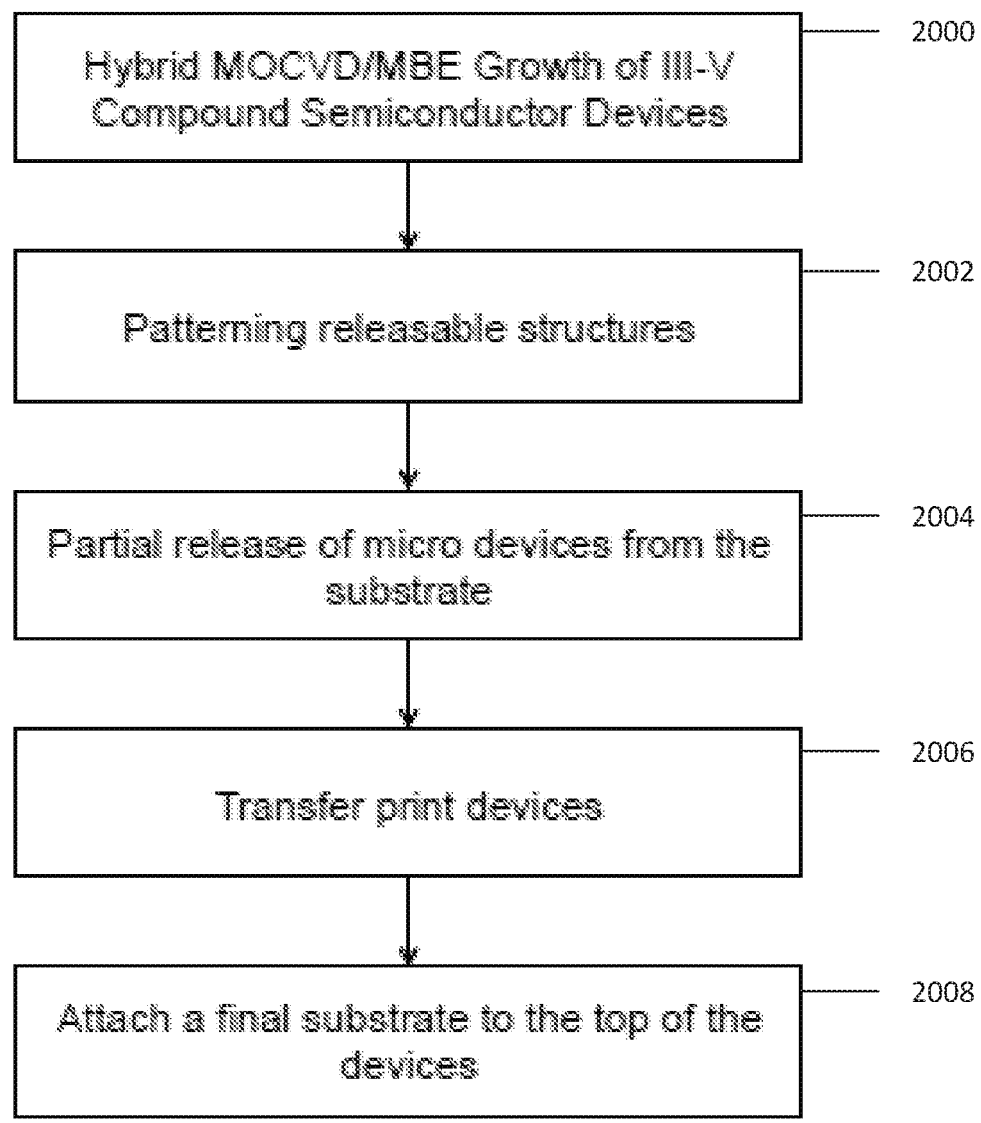
FIG. 20 is a flowchart of the fabrication method of the present invention.

FIG. 20 illustrates a fabrication method of the present invention, which includes the following steps: (1) a hybrid MOCVD/MBE growth of III-V compound semiconductor light-emitting film(s) homoepitaxially or heteroepitaxially on a first host substrate (Block 2000), e.g., to form the micro-devices with tunnel junctions (Block 2000); (2) patterning the film(s) into structures to allow for the devices (e.g., micro-device) to be released from the host substrate (Block 2002); (3) partial release of the micro devices from the substrate (Block 2004); (4) transfer printing of the devices (Block 2006), e.g., onto an intermediate substrate as a transfer medium and then onto another second substrate; and (5) attaching a final (e.g., third) substrate (Block 2008), e.g., to the top of the devices so that the devices are sandwiched between the second and third substrates. In one or more embodiments, the host substrate is a bulk III-V material that is the same as the epitaxial film, e.g., III-nitride or III-arsenide. In other embodiments, the host substrate is made of foreign material, such as sapphire, silicon or silicon carbide.

In one or more embodiments, patterning the films (Block 2002) comprises patterning the epitaxial film into one or more micro devices on the host substrate and adding electrical contacts to the devices; patterning structures in the epitaxial film that expose a sacrificial layer to be undercut; patterning anchoring structures that connect the devices to each other while the devices are being undercut and separated from the substrate; and removing the sacrificial layer (e.g., having a bandgap that corresponds to a wavelength above 400 nm) via a photoelectrochemical (PEC) etch, wherein the devices are immersed in a chemical solution (e.g., potassium hydroxide) and exposed to a light source (e.g., emitting electromagnetic radiation having wavelength below 420 nm). In one or more embodiments, the epitaxial film includes the sacrificial layer.

In one or more embodiments, the anchoring structures are patterned by depositing material onto the devices or are patterned from the existing epitaxial film.

In one or more embodiments, transfer printing of the devices (Block 2006) comprises removing the devices from a first substrate by bonding the devices to a temporary substrate and mechanically fracturing parts of a pattern that connects the devices to each other; transferring the devices from the temporary substrate onto a second substrate; and bonding exposed surfaces of the transferred devices to a third substrate, thereby sandwiching the devices in between the second and third substrates.

In one or more embodiments, the temporary substrate is a rubber stamp or other elastomeric material, and/or a tackiness of the temporary substrate is varied.

In one or more embodiments, the second substrate has an adhesive layer (e.g., a UV-curable polymer).

In one or more embodiments, the second and/or third substrate is a transparent substrate, a flexible substrate (e.g., a polymeric film) and/or a rigid substrate comprising e.g., at least one material selected from sapphire, silicon, and silicon carbide.

In one or more embodiments, the second and/or third substrate has electrical interconnections patterned thereon and the electrical interconnections are made of metal or a transparent conducting oxide to provide transparency.

In one or more embodiments, the red, green, and blue display subpixels are comprised of the devices made from different epitaxial films.

ILLUSTRATIVE EXAMPLES

Figures 21A, 21B:
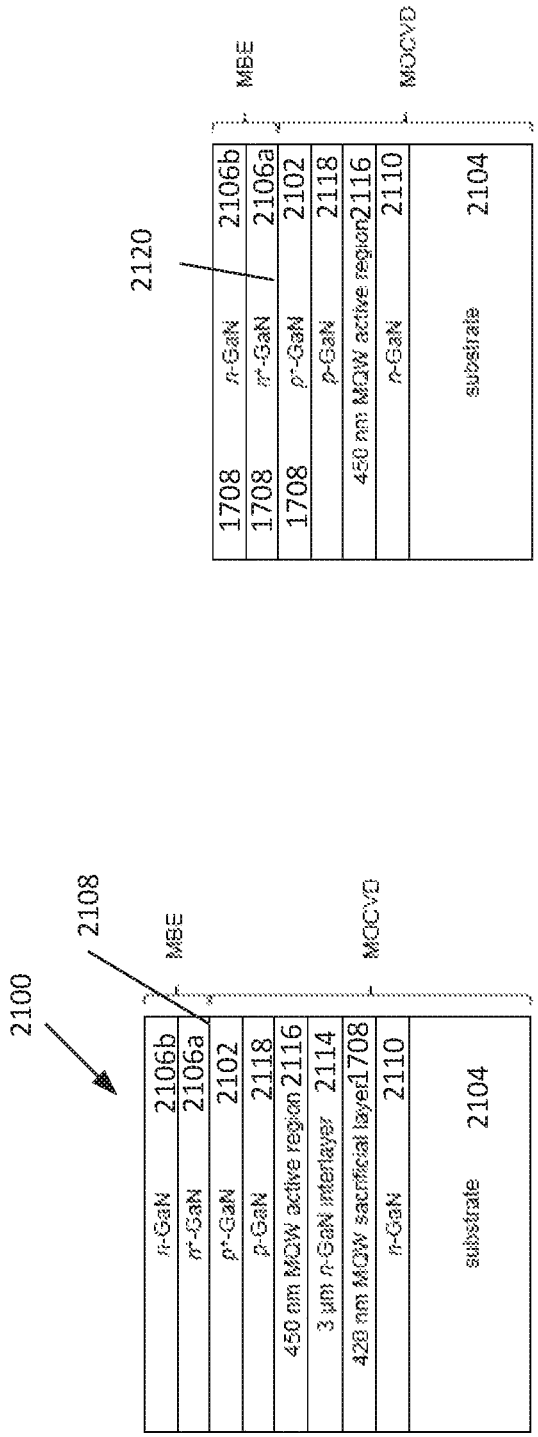
FIGS. 21(a)-21(b) illustrate a hybrid MOCVD/MBE epitaxial growth structure of the present invention.

These steps are illustrated by the schematics in FIGS. 21(*a*)-(*b*) and 22(*a*)-(*h*).

In the hybrid growth step (1), as shown in FIGS. 21(*a*)-(*b*), an LED structure 2100 with a final layer 2102 (e.g., of highly doped p$^+$-GaN) is grown by MOCVD on a substrate 2104, and then highly doped III-nitride 2106*a*, 2106*b* (e.g., n$^+$-GaN and n-GaN) is grown by MBE on top of the final layer 2102 (e.g., highly doped p$^+$-GaN) to form a tunnel junction 2108.

In one embodiment, shown in FIG. 21(*a*), utilizing PEC etching as the undercut method, the LED is comprised of n-type III-nitride 2110 (e.g., n-GaN), a sacrificial layer 2112 (e.g., InGaN/GaN quantum wells), an interlayer 2114 (e.g., a thick n-GaN interlayer, e.g., having a thickness of 3 micrometers), an active layer 2116 (e.g., InGaN/GaN multi-quantum wells (MQW), e.g., absorbing light having a 450 nm wavelength) a p-type III-nitride layer 2118 (e.g., p-GaN), and the final layer 2102 (e.g., highly doped p$^+$-GaN). The sacrificial layer 2112 that is grown must have a band gap (e.g., absorbing light having a 420 nm wavelength) that is smaller than that of the light source to be used.

In another embodiment, shown in FIG. 21(*b*), utilizing LLO as the undercut method, the LED 2100 is comprised of n-type III-nitride 2110 (e.g., n-GaN), an active layer 2116 (e.g., made of InGaN/GaN multi-quantum wells), p-type III-nitride 2118 (e.g., p-GaN), and highly doped p+-type III-nitride 2102 (e.g., p$^+$-GaN). As used herein, a p+-type layer is a layer having higher p-type dopant concentration than a p-type layer, and an n+-type layer is a layer having a higher n-type dopant concentration than an n-type layer.

In both embodiments, after p$^+$-GaN is grown, the wafer is removed from the MOCVD system and annealed in a furnace over 500° C. for more than 10 minutes. The wafer is then placed in a MBE system to grow a highly doped n$^+$-GaN layer and a thick layer of n-GaN, which completes the tunnel junction 2108. This regrowth interface 2120 between the p$^+$-GaN and n$^+$-GaN serves as the p-n interface for the tunnel junction 2108.

In another embodiment, the device would be an AlInGaP LED. In this embodiment, the sacrificial layer 2112 may be an AlAs layer. The growth can either be done homoepitaxially, where the substrate 2104 is the same material as that of the LED (such as GaN), or heteroepitaxially, where the substrate is a foreign one, such as sapphire, silicon, silicon carbide, etc.

In the patterning step (2), micro devices 2200 comprising layers 2110, 2116, 2118, 2102, 2106a-b are patterned, so that the devices 2200 are the appropriate size, the sacrificial layer 2112 is exposed, the light-emitting layer 2116 is protected, and anchors 2202 are added, as shown in FIGS. 22(a) and 22(b).

In the embodiment utilizing PEC etching, mesas 2204 are etched to expose the thick n-GaN interlayer 2114. Any layers that are affected by PEC etching are then protected by depositing dielectric material, such as silicon nitride ($Si_3N_4$), around the layers, so that the layers are isolated from electrolyte. A second etch is performed to expose the sacrificial layer 2112 for PEC etching. Metallization is performed to electrically contact the top n-GaN 2106b of the tunnel junction and the interlayer n-GaN 2114. These metals serve as low resistance electrical contacts to the n- and p-sides of the GaN and could contain any combination of Al, Ni, Ti, Au or other metals. The final, lateral dimensions L of the device 2200 may be smaller than 50 μm. Anchors 2202 that physically keep the devices attached to the substrate 2104 are also added by a mesa etch and dielectric deposition, so that the devices 2200 do not float freely in solution during the PEC etch.

In the embodiment utilizing LLO, mesas 2204 are etched to expose the bottom n-GaN layer 2110. Any layers that are affected by LLO are then protected by depositing dielectric material, such as silicon nitride, around the layers, so that the layers are isolated from electrolyte. Metallization is performed to electrically contact the top n-GaN 2106 of the tunnel junction and the interlayer n-GaN 2114. These metals serve as low resistance electrical contacts to the n- and p-sides of the GaN and could contain any combination of Al, Ni, Ti, Au or other metals. The final, lateral dimensions L of the device may be smaller than 50 μm. Anchors that physically keep the devices attached to the substrate are also added by a mesa etch and dielectric deposition, so that the devices do not move away during LLO.

In the release step (3), the micro devices 2200 are released by way of a PEC etch of a sacrificial layer 2112, as shown in FIG. 22(c), or LLO from the host substrate (not shown).

In one embodiment, the device 2200 is an InGaN LED with a sacrificial layer that includes InGaN/GaN quantum wells. In one example, the sacrificial etch is a PEC etch, where the patterned substrate with devices 2200 is immersed into a solution and light is shined onto the devices. The light generates electron-hole pairs within a semiconductor layer that has a band gap smaller than that of the light. The photogenerated carriers react chemically with the semiconductor and solution to etch away the sacrificial layer 2112. In one example, the light source is an LED array emitting around 405 nm and the electrolyte is potassium hydroxide. Depending on the band gap of the active layer 2116 multi-quantum wells (MQW), holes and electrons may also be photogenerated within this layer 2116. However, if the active layer 2116 is protected with dielectric, the layer 2116 will not be etched. The PEC etch will result in a device 2200 that is above the substrate 2104, but still attached by way of the anchors 2202.

PEC etching is not limited to the III-nitride family and is used in other III-V systems, such as GaAs and InP. In another embodiment, where the device is an AlInGaP LED, the sacrificial layer can be AlAs. In one example of the AlInGaP device, the release mechanism is a selective etch using various acids and/or bases. After the etch, the devices are partially released; they are still attached to the substrate 2104 through the anchor 2202.

In another embodiment, the device would be an InGaN LED grown on a sapphire substrate. A high-energy laser is used in LLO to decompose the material at the GaN/sapphire interface, so that the substrate can be removed. The sample is then heated above 30° C. to melt away any residual material.

In the transfer step (4), an intermediate temporary substrate 2206, such as a rubber stamp or other elastomer, is temporarily bonded to the top of the devices 2200 as a transfer medium, as shown in FIG. 22(d). This rubber stamp can be prepared so that it has some certain tackiness, such that it will stick to the devices easily. At this point, the devices 2200 are between the host substrate 2104 (below) and the temporary substrate 2206 (e.g., rubber stamp (above)), forming one group.

Once attached, the devices 2200 are then permanently removed from the host substrate 2104 by mechanical fracture of the anchors 2202 that hold the devices 2200 to the substrate 2104, as shown in FIG. 22(e). The mechanical fracture is performed by physically ripping the temporary transfer substrate 2206 (e.g., stamp) away from the host substrate 2104 below the devices 2200. The patterning of the anchors 2200 is performed so that they are thin enough that the mechanical fracture requires little force. At this point, the tops of the devices 2200 are temporarily bonded to the transfer/temporary substrate 2206 (e.g., rubber stamp).

To transfer print to a second substrate 2208, the second substrate 2208 must be prepared. In one embodiments, the second substrate 2208 has a thin adhesive layer 2210 of a ultraviolet radiation curable (UV-curable) polymer (such as polyurethane). The transfer medium 2206 (e.g., rubber stamp) and temporarily bonded device 2200 are then slowly pressed against the second substrate 2208 until the device 2200 makes contact, as shown in FIG. 22(f). In one example, the whole system of the second substrate 2208, transfer medium 2206 (e.g., rubber stamp), and device 2200 is then initially cured in UV ozone for greater than 10 minutes to promote adhesion of the device(s) 2200 and the second substrate 2208.

In one example, after the initial curing, the transfer medium 2206 (e.g., rubber stamp) is removed, and the UV curable polymer 2210 on the second substrate 2208 is further cured, as shown in FIG. 22(g). Once the device(s) 22 are bonded to the second substrate 2208, any final encapsulation or interconnect metallization that is necessary is performed.

The second substrate 2208 can be made of any material. For heat sinking, silicon carbide (SiC) is advantageous. For optical transparency, glass or sapphire may be desired. For flexibility, a polymeric film such as polyimide or polyethylene terephthalate would be used.

In the attaching step (5), a final third substrate 2212 may be attached to the top surface 2214 of the device(s) 2200, as shown in FIG. 22(h). Prior to attaching the third substrate 2212 to the device(s) 2200, the substrate 2212 may have electrical interconnections that are already patterned. When the third substrate 2212 is eventually attached, the device(s) 2200 are then able to be electrically contacted through patterns on the substrate (2212). The interconnects may be made of metal or a TCO to allow for transparency.

FIGS. 23(a)-(e) illustrate a method to assemble and arrange RGB subpixels 2300 side-by-side on the second substrate 2208 to create pixels 2302 of a display 2304. The technique is similar to transferring one subpixel 2300.

In order to create a full-color display, three sources of epitaxially grown material are needed: one for red, one for green, and one for blue. These epitaxial films can be made of different systems (such as m-nitrides, III-arsenides, etc.). Subpixels 2300 of one color are transferred onto a final substrate 2306 while leaving space for the subpixels 2300 of the two other colors.

One example pattern is shown in FIG. 23(a), but any pattern can be used. In this example, the pixels 2302 are shown in a top-down perspective. The larger outer rectangle 2306 represents an area of the display 2304. The long dashed 2308 rectangles indicate empty spaces where light-emitting devices 2200 should be placed, wherein each dashed rectangle 2308 comprises a subpixel 2300 (they are marked R, G, or B to represent the color of the subpixel 2300). The squares 2310 that encompass each three RGB subpixels 2300 represent an individual pixel 2302, which is indicated as being 25 micrometers ($\mu$m) long on a side.

The intermediate substrate 2206 or transfer medium (e.g. the rubber stamp) upon which the light-emitting devices 2200 are temporarily bonded can be molded and patterned so that it leaves enough spacing (e.g., 25 $\mu$m) for the subpixels 2300 of the other colors, as shown in FIG. 23(b).

Light-emitting devices 2200 are transferred until all subpixel 2300 spaces of a pixel 2302 are filled, as shown in FIGS. 23(c)-23(e). To assemble a pixel 2302, each of the subpixels 2300 are transferred to the pixel 2302. In one embodiment, the red subpixels 2300 are transferred into the R spaces, as shown by the shaded dashed rectangles 2312a in FIG. 23(c); the green subpixels 2300 are transferred into the G spaces, as shown by the additional shaded dashed rectangles 2312b in FIG. 23(d); and the blue subpixels 2300 are transferred into the B spaces, as shown by the additional shaded dashed rectangles 2312c in FIG. 23(e). At this point, the pixels 2302 are fully assembled.

Low Hydrogen Overpressure Technique

Figure 24:
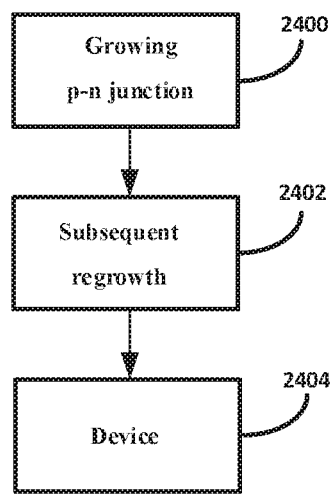
FIG. 24 is a flowchart illustrating a method according to one or more embodiments of the present invention.

FIG. 24 illustrates a method of growing a III-V semiconductor film. The method comprises the following steps.

Block 2400 represents growing a p-n junction 1210 with a light-emitting active region 1206 using metalorganic chemical vapor deposition (MOCVD).

Block 2402 represents performing a subsequent regrowth using a technique involving low hydrogen overpressure so that the activated MOCVD grown material forming the p-n junction is not passivated with hydrogen.

In one or more embodiments, the subsequent regrowth forms a tunnel junction 1216.

Block 2404 represents the end result, a device, e.g., as illustrated in FIG. 12(a) after additional processing steps are performed.

In one or more embodiments, the p-n junction comprises an n-type layer 1202, a p-type layer 1208, and the light-emitting active region 1206 between the p-type layer 1208 and the n-type layer 1202, the subsequent regrowth comprises another n-type layer 1214a-c, the n-type layer 1202 and the active region 1206 are grown using MOCVD, and the p-type layer 1208 and the another n-type layer 1214a-c are grown by the technique involving low hydrogen overpressure. In one or more embodiments, the n-type layer 1202, the light-emitting active region 1206, and the p-type layer a 1208 re grown using MOCVD, and the another n-type layer 1214a-c is grown by the technique involving low hydrogen overpressure.

In one or more embodiments, the subsequent regrowth includes doped p-type material 618 having a higher p-type dopant concentration than the p-type layer 612.

Modifications and Alternatives

The present invention provides a number of modifications and alternatives.

This invention allows for displays that can be integrated onto any surface by choosing an appropriate substrate.

In certain embodiments, the display will be flexible if the substrate chosen has the property of being flexible. Such substrates include polymeric materials, polyimide or polyethylene terephthalate. This substrate can then be attached to a curved surface.

In certain embodiments, the display will be transparent if the substrate chosen and the metal contacts are transparent. These substrates and contacts could be glass and transparent conducting oxides, respectively.

In certain embodiments, the display will be opaque if the substrate is chosen as such. This embodiment will allow for high brightness displays by including a mirror that is made out of reflective material, such as silver.

Advantages and Benefits

The present invention provides a number of advantages and benefits.

Self-emissive inorganic III-V light-emitting devices can be used as RGB subpixels in many different types of displays. The use of a tunnel junction allows for low resistance devices.

With state of the art III-V compound semiconductor LEDs, energy efficiencies can at least double that of OLED displays. Moreover, with the small pixel sizes of III-V compound semiconductor LEDs, ultra-high resolution can be achieved.

The combination of PEC etching or LLO and transfer printing allows for high throughput and yield during manufacturing. The combination of an undercut mechanism, such as PEC etching or LLO, and thin film layer transfer, through transfer printing, allows for unique display forms to be made.

Indeed, by using transfer printing, any size display can be fabricated with ultra-high resolution. In addition to display monitors or mobile phone displays, micro-LED displays can be used on near-eye and head-mountable technologies, where pixels must be very small in order to provide ultra-high resolution.

With this invention, displays that are flexible are possible as well, and displays can be integrated onto any surface by choosing an appropriate substrate. Subpixels can be transferred onto a transparent, flexible substrate, such as polyimide or polyethylene terephthalate, and the substrate can then be attached to a curved surface. In addition to having curved television screens or mobile devices, these micro-LED displays can be integrated onto transparent surfaces, such as a car dashboard or a glass window.

Transparent stand-alone displays are also possible with this invention. By using TCOs, such as indium tin oxide or zinc oxide, for metal contacts and transparent substrates, such as glass or a polymeric film, the entire device will be transparent.

REFERENCES FOR PART D

The following publications, referenced above are relevant to this disclosure and are incorporated by reference herein.

[1] U.S. Patent Application Publication No. 2015/0372187 A1, published on Dec. 24, 2015, by Bower et al., entitled "Systems and methods for preparing GaN and related materials for micro assembly."

[2] M. A. Meitl, Z.-T. Zhu, V. Kumar, K. J. Lee, X. Feng, Y. Y. Huang, I. Adesida, R. G. Nuzzo, and J. A. Rogers, "Transfer printing by kinetic control of adhesion to an elastomeric stamp," Nat. Mater., vol. 5, no. 1, pp. 33-38, 2006.

[3] S.-I. Park, Y. Xiong, R-H. Kim, P. Elvikis, M. A. Meitl, D. Kim, J. Wu, J. Yoon, C. Yu, Z. Liu, Y. Y. Huang, K. Hwang, P. Ferreira, X. Li, K. Choquette, and J. A. Rogers, "Printed assemblies of inorganic light-emitting diodes for deformable and semitransparent displays," Science, vol. 325, no. 5943, pp. 977-981, 2009.

[4] H. Kim, E. Brueckner, J. Song, Y. Li, S. Kim, C. Lu, J. Sulkin, K. Choquette, Y. Huang, R G. Nuzzo, and J. A Rogers, "Unusual strategies for using indium gallium nitride grown on silicon (III) for solid-state lighting," Proc. Natl. Acad. Sci. U.S.A, vol. 108, no. 25, pp. 10072-10077, 2011.

NOMENCLATURE

The term "III-nitrides" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$.

Spontaneous and piezoelectric polarization effects in GaN or III-nitride based devices are eliminated by growth of the device on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal to form semipolar device layers. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Polar c-plane devices can also be fabricated. The Gallium or Ga face of GaN is the $c^+$ or (0001) plane, and the Nitrogen or N-face of GaN or a III-nitride layer is the $c^-$ or (000-1) plane.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic or electronic device, comprising:
a p-n junction structure comprising a p-type III-nitride layer on or above an n-type III-nitride layer; and
n-type III-nitride material on a surface treated surface of the p-type III-nitride layer, forming a tunnel junction between the p-type III-nitride layer and the n-type III-nitride material, wherein the treating reduces a concentration of acceptors or impurities at the interface of the tunnel junction with the p-type III-nitride layer and in the n-type III-nitride material, such that:
a Magnesium concentration at the interface is no more than $1.3e19/cm^3$, and
an Oxygen concentration at the interface is no more than $1.2e18/cm^3$.

2. The device of claim 1, wherein the surface treated surface has been exposed to at least one of a Hydrogen Fluoride (HF) solution, a Hydrogen Chloride (HCL) solution, a mixture of Nitric acid and HCl, gaseous HF, gaseous HCL, or Xenon difluoride ($XeF_2$).

3. The device of claim 1, wherein the surface treated surface is an etched surface.

4. The device of claim 1, further comprising:
a mesa formed in the p-n junction structure, the mesa having one or more lateral dimensions less than or equal to 200 micrometers and wherein the p-type III-nitride layer is reactivated by lateral diffusion of hydrogen through the mesa's sidewalls.

5. The device of claim 1, wherein:
the n-type III-nitride material is grown using MOCVD, and
the p-type III-nitride layer and the tunnel junction are grown using chemical vapor deposition (CVD).

6. The method of claim 1, further comprising a doped p-type material on the p-type III-nitride layer and having a higher p-type dopant concentration than the p-type III-Nitride layer so as to reduce contact resistance of the tunnel junction, wherein the n-type III-nitride material is on the doped p-type material.

7. The device of claim 1, wherein the n-type III-nitride material has a thickness between about 1 nanometers (nm) to about 5000 nm.

8. The device of claim 1, wherein delta-doping is used at a regrowth interface between the n-type III-nitride material and the p-type III-nitride layer.

9. The device of claim 1, further comprising a second active region on the p-n junction structure, the second active region grown using metal organic chemical vapor deposition (MOCVD).

10. The device of claim 9, further comprising:
a first light emitting diode (LED) comprising a first active region including the p-n junction structure, the first LED emitting a first wavelength of light, and
a second LED comprising the second active region, the second LED emitting a second wavelength similar to the first wavelength, such that an efficiency droop if the device is reduced through use of the multiple active regions comprising the first active region and the second active region.

11. A method of making an optoelectronic or electronic device, comprising:
depositing a p-n junction structure comprising a p-type III-nitride layer on or above an n-type III nitride layer;
treating a surface of the p-type III nitride layer; and
depositing an n-type III-nitride material on the surface treated surface of the p-type III-nitride layer, forming a tunnel junction between the p-type III-nitride layer and the n-type III-nitride material, wherein the treating reduces a concentration of acceptors or impurities at the interface of the tunnel junction with the p-type III-nitride layer and in the n-type III-nitride material such that:
a Magnesium concentration at the interface is no more than $1.3e19/cm^3$, and an Oxygen concentration at the interface is no more than 1.2e18/cm³.

12. The method of claim 11, wherein the treating comprises exposing the surface to at least one of a Hydrogen Fluoride (HF) solution, a Hydrogen Chloride (HCL) solution, a mixture of Nitric acid and HCl, gaseous HF, gaseous HCL, or Xenon difluoride (XeF₂).

13. The method of claim 12, wherein the treating comprises etching prior to the exposing.

14. The method of claim 11, further comprising:
forming a mesa in the p-n junction structure, the mesa having one or more lateral dimensions less than or equal to 200 micrometers and wherein the p-type III-nitride layer is reactivated by lateral diffusion of hydrogen through the mesa's sidewalls.

15. The method of claim 11, wherein the depositing comprises:
growing the n-type III-nitride material using MOCVD, and
growing the p-type III-nitride layer and the tunnel junction using chemical vapor deposition (CVD).

16. The method of claim 11, further comprising forming a doped p-type material on the p-type III-nitride layer, the doped p-type layer having a higher p-type dopant concentration than the p-type III-Nitride layer so as to reduce contact resistance of the tunnel junction, wherein the n-type III-nitride material is on the doped p-type material.

17. The method of claim 11, wherein the n-type III-nitride material has a thickness between about 1 nanometers (nm) to about 5000 nm.

18. The method of claim 11, further comprising performing delta-doping at a regrowth interface between the n-type III-nitride material and the p-type III-nitride layer.

19. The method of claim 11, further comprising growing a second active region on the p-n junction structure using metal organic chemical vapor deposition (MOCVD).

20. The method of claim 19, further comprising:
depositing a first light emitting diode (LED) comprising a first active region including the p-n junction structure, the first LED emitting a first wavelength of light; and
depositing a second LED comprising the second active region, the second LED emitting a second wavelength similar to the first wavelength, such that an efficiency droop if the device is reduced through use of the multiple active regions comprising the first active region and the second active region.

* * * * *